US012666795B2

(12) United States Patent
Peng et al.

(10) Patent No.: US 12,666,795 B2
(45) Date of Patent: Jun. 23, 2026

(54) TRANSPARENT OLED SUBSTRATE, TRANSPARENT DISPLAY PANEL, ARRAY SUBSTRATE, DISPLAY PANEL, AND DISPLAY DEVICE

(71) Applicants: Yungu (Gu'an) Technology Co., Ltd., Langfang (CN); KunShan Go-Visionox Opto-Electronics Co., Ltd., Kunshan (CN)

(72) Inventors: ChaoChi Peng, Kunshan (CN); Mingxing Liu, Kunshan (CN); Shuaiyan Gan, Kunshan (CN)

(73) Assignees: Yungu (Gu'an) Technology Co., Ltd., Langfang (CN); KunShan Go-Visionox Opto-Electronics Co., Ltd., Kunshan (CN)

( * ) Notice: Subject to any disclaimer, the term of this patent is extended or adjusted under 35 U.S.C. 154(b) by 312 days.

(21) Appl. No.: 18/406,751

(22) Filed: Jan. 8, 2024

(65) Prior Publication Data

US 2024/0147809 A1 May 2, 2024

Related U.S. Application Data

(63) Continuation of application No. 17/143,429, filed on Jan. 7, 2021, now Pat. No. 11,910,691, which is a
(Continued)

(30) Foreign Application Priority Data

Dec. 28, 2018 (CN) .......................... 201811627712.0

(51) Int. Cl.
*H10K 59/121* (2023.01)
*H10K 50/17* (2023.01)
(Continued)

(52) U.S. Cl.
CPC ......... *H10K 59/121* (2023.02); *H10K 50/171* (2023.02); *H10K 59/1216* (2023.02);
(Continued)

(58) Field of Classification Search
None
See application file for complete search history.

(56) References Cited

U.S. PATENT DOCUMENTS

2017/0047387 A1* 2/2017 Yamazaki ............ H10K 59/123
2017/0155085 A1 6/2017 Kwon et al.
(Continued)

FOREIGN PATENT DOCUMENTS

CN 201402347 Y 2/2010
CN 102237370 A 11/2011
(Continued)

OTHER PUBLICATIONS

International Search Report issued on Mar. 27, 2020, in corresponding Application No. PCT/CN2019/130726, 6 pages.
(Continued)

*Primary Examiner* — Anthony Ho
(74) *Attorney, Agent, or Firm* — Maier & Maier, PLLC

(57) ABSTRACT

A transparent OLED substrate, a transparent display panel, an array substrate, a display screen, and a display device. The transparent OLED substrate includes a base substrate, a driving circuit layer formed on the base substrate; and a light emitting functional film layer formed on the driving circuit layer. The driving circuit layer includes a plurality of first driving circuit units, the plurality of first driving circuit units each include a storage capacitor and a first transistor, the storage capacitor includes a first electrode plate and a second electrode plate. The driving circuit layer further includes a first conductive layer, a part of the first conductive layer is
(Continued)

performed as the first electrode plate and other part is performed as a gate electrode of the first transistor.

18 Claims, 10 Drawing Sheets

Related U.S. Application Data continuation of application No. PCT/CN2019/098813, filed on Aug. 1, 2019.

(51) Int. Cl.

| | |
|---|---|
| *H10K 59/127* | (2023.01) |
| *H10K 77/10* | (2023.01) |
| *G09G 3/3225* | (2016.01) |
| *H10K 59/12* | (2023.01) |
| *H10K 59/131* | (2023.01) |
| *H10K 59/65* | (2023.01) |
| *H10K 59/80* | (2023.01) |
| *H10K 102/00* | (2023.01) |
| *H10K 102/10* | (2023.01) |

(52) U.S. Cl.
CPC ......... *H10K 59/127* (2023.02); *H10K 77/111* (2023.02); *G09G 3/3225* (2013.01); *H10K 59/1201* (2023.02); *H10K 59/131* (2023.02); *H10K 59/65* (2023.02); *H10K 59/80517* (2023.02); *H10K 59/80523* (2023.02); *H10K 59/80524* (2023.02); *H10K 2102/103* (2023.02); *H10K 2102/311* (2023.02); *H10K 2102/351* (2023.02)

(56) References Cited

U.S. PATENT DOCUMENTS

| | | | |
|---|---|---|---|
| 2019/0293975 A1 | 9/2019 | Cheng | |
| 2019/0334067 A1* | 10/2019 | Lo | H01L 25/167 |
| 2019/0393286 A1 | 12/2019 | Ding et al. | |

FOREIGN PATENT DOCUMENTS

| | | | |
|---|---|---|---|
| CN | 105372882 A | 3/2016 |
| CN | 106876601 A | 6/2017 |
| CN | 107425040 A | 12/2017 |
| CN | 107946341 A | 4/2018 |
| CN | 107958186 A | 4/2018 |
| CN | 108022962 A | 5/2018 |
| CN | 207517684 U | 6/2018 |
| CN | 108281556 A | 7/2018 |
| CN | 108376696 A | 8/2018 |
| CN | 108540613 A | 9/2018 |
| CN | 108810200 A | 11/2018 |
| CN | 208076869 U | 11/2018 |
| CN | 109144320 A | 1/2019 |
| CN | 208384467 U | 1/2019 |
| CN | 209487511 U | 10/2019 |
| CN | 211654824 U | 10/2020 |
| JP | 2004333904 A | 11/2004 |
| JP | 2004335123 A | 11/2004 |
| JP | 2005182152 A | 7/2005 |
| KR | 1020050093527 A | 9/2005 |

OTHER PUBLICATIONS

Written Opinion issued on Mar. 27, 2020, in corresponding Application No. PCT/CN2019/130726, 9 pages.

Office Action issued on Mar. 31, 2025, in corresponding Chinese Application No. 201811627712.0, 21 pages.

Office Action issued on Nov. 7, 2024, in corresponding Chinese Application No. 201811627712.0, 14 pages.

Office Action issued on Jun. 17, 2020 in corresponding Taiwanese application No. 108129071; 14 pages including Machine-generated English-language translation.

Office Action issued on Sep. 29, 2019 in corresponding Chinese application No. 201920703006.3; 2 pages including Machine-generated English-language translation.

Office Action and Search Report issued on Nov. 19, 2019 in corresponding Chinese application No. 201920703006.3; 2 pages including Machine-generated English-language translation.

International Search Report issued on Nov. 6, 2019 in corresponding International application No. PCT/CN2019/098813; 4 pages.

Written Opinion of the International Searching Authority issued on Nov. 6, 2019 in corresponding International application No. PCT/CN2019/098813; 4 pages.

* cited by examiner

/S1011
Form a base substrate layer

/S1012
Form a groove at a position of the base substrate layer corresponding to the first display area /S1014
Form a protection layer on the inner surface of the groove and beneath the base substrate /S1013
Form a transparent material layer in the groove /S1015
Form a protective layer beneath the transparent material layer

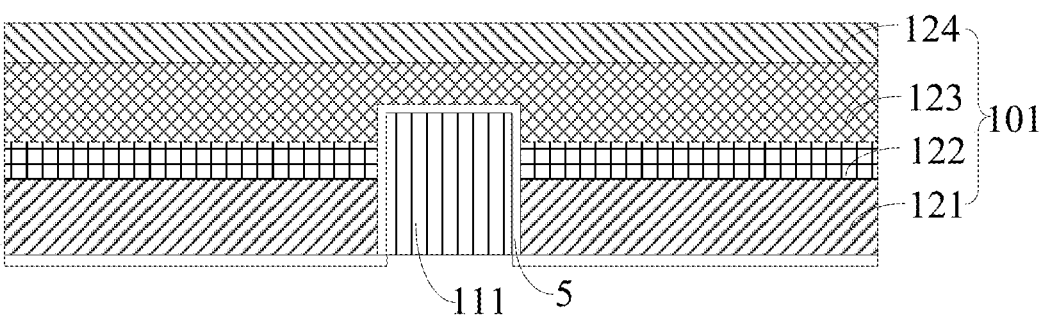
FIG. 17
S1041
Form a first conductive film layer on the light emitting functional film layer, where the first conductive film layer covers the first display region and the second display region
S1042
Form a second conductive film layer on the first conductive film layer, where the second conductive film layer is disposed in the second display region
FIG. 18
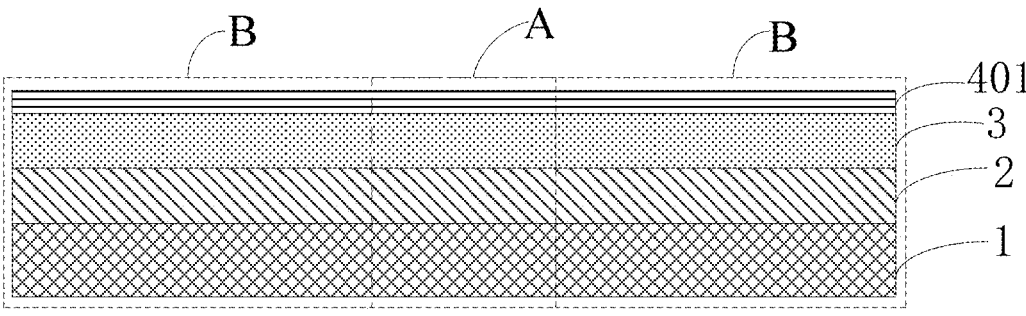
FIG. 19
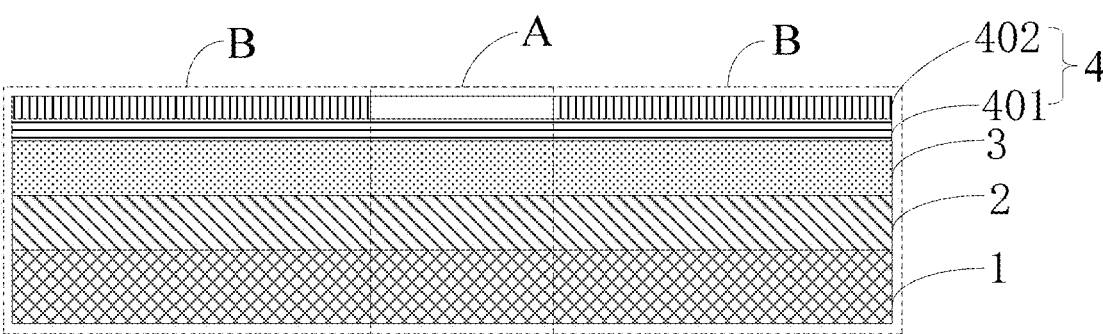
FIG. 20

TRANSPARENT OLED SUBSTRATE, TRANSPARENT DISPLAY PANEL, ARRAY SUBSTRATE, DISPLAY PANEL, AND DISPLAY DEVICE

CROSS REFERENCE TO RELATED APPLICATIONS

This disclosure is a continuation application of U.S. application Ser. No. 17/143,429, which is a continuation application of International Patent Application No. PCT/CN2019/098813, filed on Aug. 1, 2019, which claims priority to Chinese Patent Application No. 2018116277120 filed on Dec. 28, 2018. The contents of all applications are incorporated herein by reference.

TECHNICAL FIELD

The present disclosure relates to the field of display technology, and more particularly, to a transparent OLED substrate, a transparent display panel, an array substrate, a display panel, and a display device.

BACKGROUND

With the rapid development of electronic devices, users have increasingly higher requirements on screen-to-body ratio, so that more and more attention is paid on the full-screen display of electronic devices in the industry. For a conventional electronic device such as a mobile phone, a tablet computer, etc., a notch may be opened on the display screen for components to be integrated, such as a front camera, an earpiece, and an infrared sensor element, so as to mount the camera, the earpiece and the infrared sensor element in the notch area. However, the notch area of the screen, such as a notch screen in the related arts, cannot be used to display images. Alternatively, the screen can be provided with an opening hole to mount a camera therein. For an electronic device with a photographing function, external light can enter a light sensing element disposed beneath the screen through the opening hole on the screen. Thus, such an electronic device is not full-screen, and the display is not performed in every area of the entire screen. For example, the camera area of the screen cannot display an image.

SUMMARY

An aspect of the present disclosure provides a transparent OLED substrate including: a base substrate; a driving circuit layer, formed on the base substrate; and a light emitting functional film layer, formed on the driving circuit layer; where the driving circuit layer includes a plurality of first driving circuit units, the plurality of first driving circuit units each include a storage capacitor and a first transistor, the storage capacitor includes a first electrode plate and a second electrode plate, and the driving circuit layer further includes a first conductive layer, a part of the first conductive layer is performed as the first electrode plate and other part is performed as a gate electrode of the first transistor.

Optionally, the driving circuit layer further includes a power supply line, a data line, a scan line, and a plurality of anode layers in one to one correspondence with the plurality of first driving circuit units; the driving circuit layer further includes a second conductive layer, a part of the second conductive layer is performed as the second electrode plate of the storage capacitor, and other part is performed as the power supply line; the first driving circuit units each further include a second transistor, a source electrode of the first transistor is electrically connected with the second conductive layer and a drain electrode of the first transistor is electrically connected with a corresponding one of the anode layers, a gate electrode of the second transistor is connected with the scan line, a drain electrode of the second transistor is electrically connected with the first conductive layer and a source electrode of the second transistor is connected with the data line.

Optionally, the first transistor, the second transistor, the storage capacitor, the data line, the scan line, and the anode layers include transparent material.

Optionally, a light transmittance of the transparent material is greater than or equal to 90%.

Optionally, the transparent material is indium tin oxide or indium zinc oxide.

Optionally, the driving circuit layer further includes a power supply line, a data line, a first scan line, a second scan line, a reference potential line and a plurality of anode layers in one to one correspondence with the plurality of first driving circuit units; the driving circuit layer further includes a third conductive layer, a part of the third conductive layer is performed as the second electrode plate of the storage capacitor, and other part is performed as a corresponding one of the anode layers; the first driving circuit units each further include a third transistor and a fourth transistor, a source electrode of the third transistor is connected with the data line, a gate electrode of the third transistor is connected with the first scan line and a drain electrode of the third transistor is electrically connected with the first conductive layer, a drain electrode of the first transistor is electrically connected with the power supply line, a source electrode of the first transistor is electrically connected with the third conductive layer, a gate electrode of the fourth transistor is connected with the second scan line, a source electrode of the fourth transistor is connected with the reference potential line and a drain electrode of the fourth transistor is electrically connected with the third conductive layer.

Optionally, the first transistor, the third transistor, the fourth transistor, the storage capacitor, the data line, the first scan line, the second scan line, the reference potential line and the anode layers include transparent material.

Optionally, a light transmittance of the transparent material is greater than or equal to 90%.

Optionally, the transparent material is indium tin oxide or indium zinc oxide.

An aspect of the present disclosure provides a transparent display panel, including: the transparent OLED substrate as mentioned above; and a first encapsulation layer, where the first encapsulation layer is provided on a side of the transparent OLED substrate away from the base substrate.

An aspect of the present disclosure provides an array substrate, including: a first OLED substrate and a second OLED substrate; where the first OLED substrate includes the transparent OLED substrate as mentioned above and the second OLED substrate is a non-transparent OLED substrate; the first OLED substrate and the second OLED substrate share a base substrate and the light emitting functional film layer of the first OLED substrate and a light emitting functional film layer of the second OLED substrate are formed in a same process.

Optionally, the first OLED substrate is at least partially surrounded by the second OLED substrate.

Optionally, a driving circuit layer of the second OLED substrate includes a plurality of second driving circuit units, and a number of transistors in each of the second driving circuit units is larger than or equal to a number of transistors in each of the first driving circuit units.

Optionally, the driving circuit layer further includes a power supply line, a data line, a scan line, and a plurality of anode layers in one to one correspondence with the plurality of first driving circuit units; the driving circuit layer further includes a second conductive layer, a part of the second conductive layer is performed as the second electrode plate of the storage capacitor, and other part is performed as the power supply line; the first driving circuit units each further include a second transistor, a source electrode of the first transistor is electrically connected with the second conductive layer and a drain electrode of the first transistor is electrically connected with a corresponding one of the anode layers, a gate electrode of the second transistor is connected with the scan line, a drain electrode of the second transistor is electrically connected with the first conductive layer and a source electrode of the second transistor is connected with the data line.

Optionally, the first transistor, the second transistor, the storage capacitor, the data line, the scan line, and the anode layers include transparent material; and a light transmittance of the transparent material is greater than or equal to 90%.

Optionally, the driving circuit layer further includes a power supply line, a data line, a first scan line, a second scan line, a reference potential line and a plurality of anode layers in one to one correspondence with the plurality of first driving circuit units; the driving circuit layer further includes third conductive layer, a part of the third conductive layer is performed as the second electrode plate of the storage capacitor, and other part is performed as a corresponding one of the anode layers; the first driving circuit units each further include a third transistor and a fourth transistor, a source electrode of the third transistor is connected with the data line, a gate electrode of the third transistor is connected with the first scan line and a drain electrode of the third transistor is electrically connected with the first conductive layer, a drain electrode of the first transistor is electrically connected with the power supply line, a source electrode of the first transistor is electrically connected with the third conductive layer, a gate electrode of the fourth transistor is connected with the second scan line, a source electrode of the fourth transistor is connected with the reference potential line and a drain electrode of the fourth transistor is electrically connected with the third conductive layer.

Optionally, the first transistor, the third transistor, the fourth transistor, the storage capacitor, the data line, the first scan line, the second scan line, the reference potential line and the anode layers include transparent material; and where a light transmittance of the transparent material is greater than or equal to 90%.

An aspect of the present disclosure provides a display panel, including: the array substrate as mentioned above; and a second encapsulation structure; where the second encapsulation structure is provided on the array substrate, and one or more light sensing elements are disposed beneath the first OLED substrate of the array substrate.

An aspect of the present disclosure provides a display device, including: a device body including a component region; and the display panel as mentioned above and covering on the device body; where the component region is located beneath the first OLED substrate, and the component region is provided with one or more light sensing elements collecting light through the first OLED substrate.

Optionally, the one or more light sensing elements includes a camera and/or a light sensor.

BRIEF DESCRIPTION OF THE DRAWINGS

FIG. 17 is a schematic structural diagram of a third intermediate structure according to an embodiment of the present disclosure.

FIG. 18 is a flowchart of a method of forming a conductive layer on a light emitting functional film layer according to an embodiment of the present disclosure.

FIG. 19 is a schematic structural diagram of a fourth intermediate structure according to an embodiment of the present disclosure.

FIG. 20 is a schematic structural diagram of a fifth intermediate structure according to an embodiment of the present disclosure.

DETAILED DESCRIPTION

A display panel and a manufacturing method thereof according to the embodiments of the present disclosure will be described in detail hereinafter in connection with the accompanying figures. The features in the following embodiments and implementations can be complementary to or be combined with each other without conflict.

On smart electronic devices such as mobile phones and tablet computers, due to the requirement that light sensing elements such as a front camera and a light sensor are to be integrated, light sensing elements can be provided on a surface of a display panel of an electronic device which faces away from light in order to achieve a full-screen display. However, as light transmittance of the display panel in the related art is low, it is difficult for the light sensing elements provided on the surface of the display panel which faces away from light to receive enough light, which makes the light sensing elements operate improperly. For example, the camera provided on the surface of the display panel which faces away from light collects less light, and thus the captured images are of poor quality.

Inventors after research found that such a kind of problem rises due to a great thickness of the film layers of the display panel, which results in low light transmittance.

Figure 1:
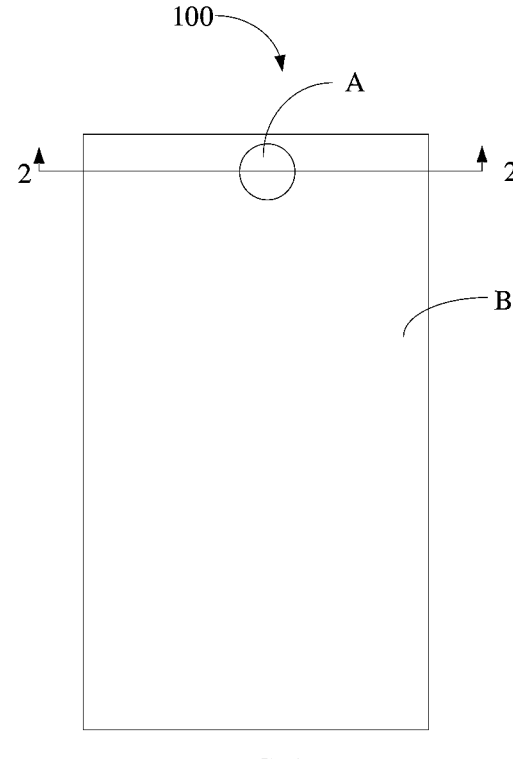
FIG. 1 is a plan view of a display panel according to an embodiment of the present disclosure.
Figure 2:
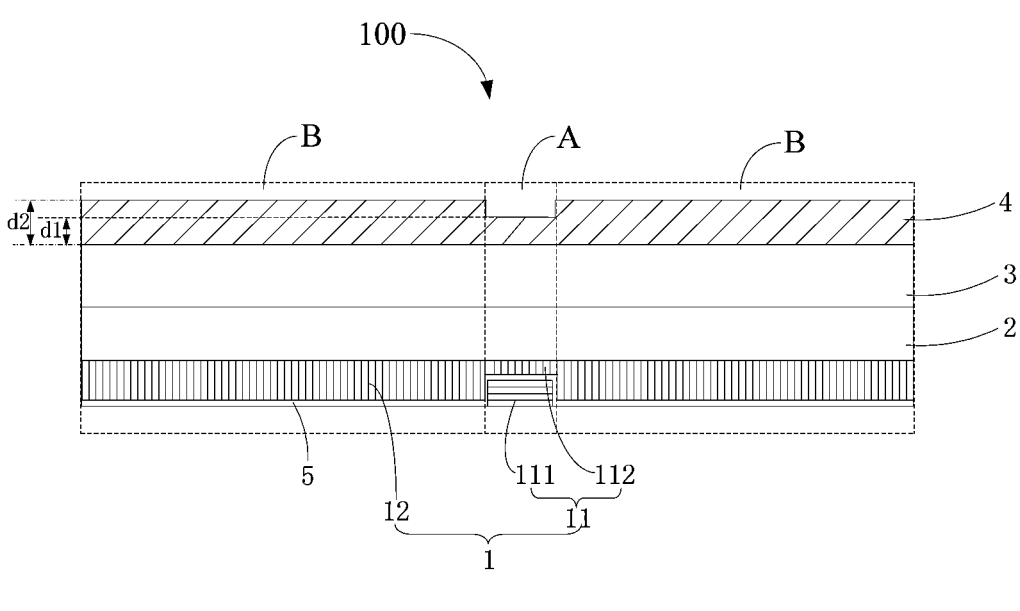
FIG. 2 is a cross-sectional view of the display panel in FIG. 1 taken along line 2-2.

In order to solve the above problem, an embodiment of the present disclosure provides a display panel. FIG. 1 is a plan view of a display panel according to an embodiment of the present disclosure. FIG. 2 is a cross-sectional view of the display panel in FIG. 1 taken along line 2-2. As illustrated in FIGS. 1 and 2, the display panel 100 includes a first display area A and a second display area B, and light sensing elements may be disposed beneath the first display area A. The display panel 100 includes a base substrate 1, a driving circuit layer 2, a light emitting functional film layer 3, and a conductive layer 4 which are located in the first display area A and the second display area B. The driving circuit layer 2 is formed on the base substrate 1, the light emitting functional film layer 3 is formed on the driving circuit layer 2, and the conductive layer 4 is formed on the light emitting functional film layer 3. A portion of the conductive layer which is located in the first display area A has a thickness d1 less than the thickness d2 of a portion of the conductive layer which is located in the second display area B.

In the embodiments of the present disclosure, for the convenience of description, a direction from the base substrate 1 towards the driving circuit layer 2 is defined as upward, and a direction from the driving circuit layer 2 towards the base substrate 1 is defined as downward, so as to determine the up-down direction. It is easy to know that different definitions for direction will not affect an actual operation content of the process and an actual shape of a product.

In the display panel 100 according to the embodiment of the present disclosure, since the portion of the conductive layer which is located in the first display area A has the thickness less than the thickness of the portion of the conductive layer which is located in the second display area B, the light transmittance of the first display area A may be greater than the light transmittance of the second display area B, so that the light sensing elements disposed beneath the first display area A can receive enough light to guarantee the light sensing element to operate properly.

The second display area B may at least partially surround the first display area A. In the display panel 100 as illustrated in FIG. 1, the second display area B completely surrounds the first display area A. In other embodiments, the second display region B may partially surround the first display region A. The second display region B is the primary display region of the display panel 100, and typically occupies more than 90% of the area of the display panel. Light sensing elements such as a camera and a light sensor may generally be configured underneath the first display region A.

Figure 3:
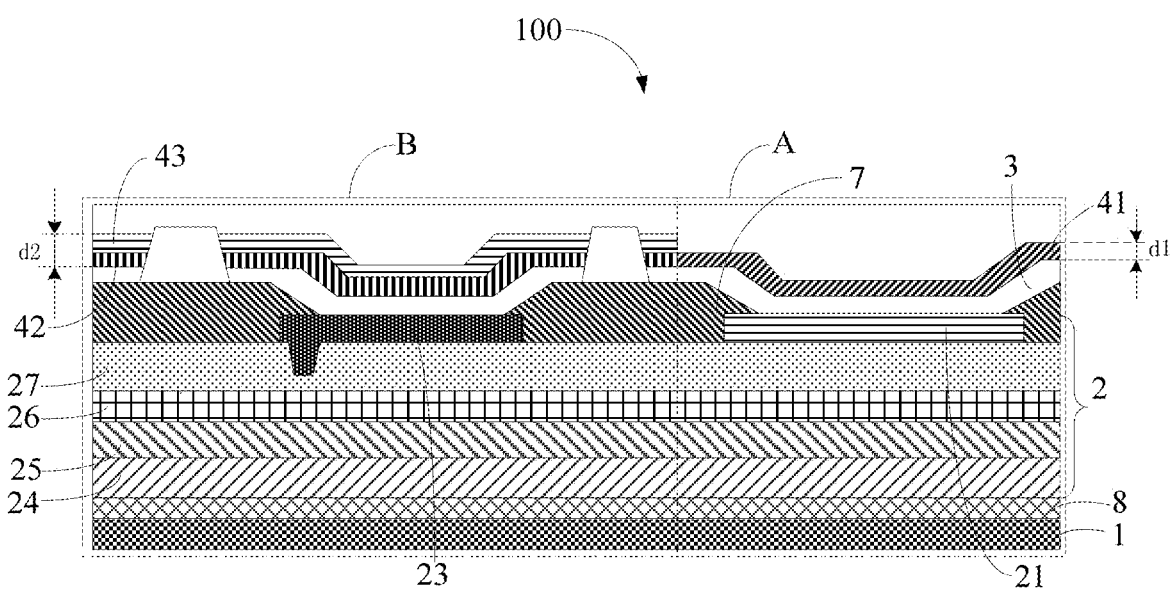
FIG. 3 is a partial cross-sectional view of the display panel in FIG. 1.

In one embodiment, referring to FIG. 3, the portion of the conductive layer 4 which is located in the first display region A is a first sub-conductive layer 41, and the portion of the conductive layer 4 which is located in the second display region includes a second sub-conductive layer 42 and a third sub-conductive layer 43 on the second sub-conductive layer 42.

The material of the first sub-conductive layer 41 is indium tin oxide, indium zinc oxide, indium tin oxide doped with silver, or indium zinc oxide doped with silver. Or, the material of the first sub-conductive layer 41 includes at least one of Mg or Ag. In an example, the first sub-conductive layer 41 includes both Mg and Ag, and the ratio of the mass of Mg to the mass of Ag ranges from 1:4 to 1:20. In this way, the light transmittance of the first display region A may be ensured to be greater, so that the sensor provided beneath the first display region A may receive more light.

One of the second sub-conductive layer 42 and the third sub-conductive layer 43 may be made of the same material as the first sub-conductive layer 41, and may be formed in a single process step. If the second sub-conductive layer 42 and the first sub-conductive layer 41 are formed at the same time, when forming the conductive layer 4, the second sub-conductive layer 42 and the first sub-conductive layer 41 are formed simultaneously, and then the third sub-conductive layer 43 is formed on the second sub-conductive layer 42. The second sub-conductive layer 42 and the first sub-conductive layer 41 are made of the same material, and the material for the third sub-conductive layer 43 may include at least one of Mg or Ag. If the third sub-conductive layer 43 and the first sub-conductive layer 41 are formed at the same time, when forming the conductive layer 4, the second sub-conductive layer 42 is formed first, and then the first sub-conductive layer 41 and the third sub-conductive layer 43 are formed at the same time. And the materials of the first sub-conductive layer 41 and the third sub-conductive layer 43 are the same. The material of the second sub-conductive layer 42 may include at least one of Mg or Ag.

In one embodiment, the conductive layer 4 may be a cathode layer. The cathode layer may be a planar electrode covering the entire region of the display panel 100. That is, the first sub-conductive layer 41 covers the first display region A, and the second sub-conductive layer 42 and the third sub-conductive layer 43 cover the second display region B.

In one embodiment, the ratio of the thickness of the first sub-conductive layer 41 in the first display region A to the thickness of the conductive layer in the second display region B (that is, the overall thickness of the second sub-conductive layer 42 and the third sub-conductive layer 43)

may range from 0.25:1 to 0.85:1. For example, the ratio may be 0.3, 0.5, 0.7, 0.85, etc. In the embodiments of the present disclosure, the thickness refers to the dimension of the film layer in the up-down direction.

Further, the thickness of the first sub-conductive layer 41 in the first display region A may range from 5 nm to 10 nm, and the overall thickness of the second sub-conductive layer 42 and the third sub-conductive layer 43 in the second display region B may range from 12 nm to 20 nm. In this way, the light transmittance of the first sub-conductive layer 41 may be kept at a good level, and the conductive performance and mechanical performance of the conductive layer 4 may be guaranteed, thus the display panel 100 can operate properly.

In one embodiment, the light emitting functional film layer 3 may include an organic light emitting material and a common layer. The common layer may include an electron injection layer, an electron transport layer, a hole injection layer, and a hole transport layer. The electron injection layer and the electron transport layer are located between the organic light emitting material and the conductive layer 4, and the hole injection layer and the hole transport layer are located between the driving circuit layer 2 and the organic light emitting material. The electron injection layer, the electron transport layer, the hole injection layer and the hole transport layer are each arranged in a form of an entire layer covering the first display region A and the second display region B.

Further, the material of the electron injection layer includes Ag, and at least one of Mg, K, Li, or Cs. In an example, the ratio of the mass of Ag in the electron injection layer to the total mass of the electron injection layer is in a range of 1:5~1:21. That is, the ratio of the mass of Ag to the mass of other components in the electron injection layer is in a range of 1:4~1:20.

The display panel 100 may further include a pixel defining layer 7 disposed in the same layer as the light emitting functional film layer 3. Pixel openings may be provided in the pixel defining layer 7, and the organic light emitting material of the light emitting functional film layer 3 is disposed within the pixel openings.

In one embodiment, referring to FIG. 2 again, the base substrate 1 may include a first base substrate 11 and a second base substrate 12. The first base substrate 11 is located in the first display region A, and the second base substrate 12 is located in the second display region B. And the light transmittance of the first base substrate 11 is greater than the light transmittance of the second base substrate 12. In this way, the light transmittance of the first display region A may be greater, which is more advantageous for the light sensing elements provided beneath the first display region A to receive more light.

The base substrate 1 may be a flexible base substrate or a rigid base substrate. The rigid base substrate may be a transparent base substrate such as a glass base substrate, a quartz base substrate, or a plastic base substrate.

Figure 4:
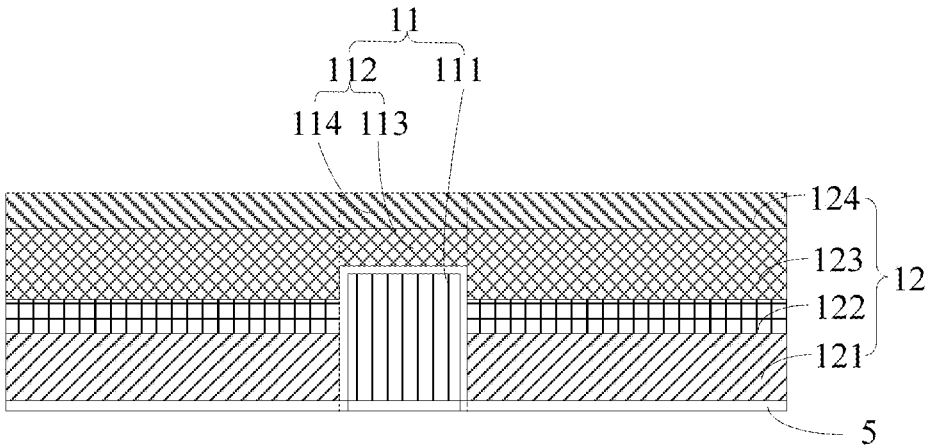
FIG. 4 is a cross-sectional view of a base substrate of the display panel illustrated in FIG. 1.

When the base substrate 1 is a flexible base substrate, referring to FIG. 4, the second base substrate 12 may be a stack structure in which one or more organic layers and one or more inorganic layers are alternately laminated. The first base substrate at least includes a transparent material layer 111, and the thickness of the first base substrate 11 is the same as the thickness of the second base substrate 12. When the thickness of the first base substrate 11 is the same as the thickness of the second base substrate 12, it is advantageous for the entire display panel 100 to have a uniform thickness, thereby making the overall display panel 100 to be more aesthetic.

In order to guarantee the high light transmittance of the first base substrate 11, the transparent material layer 111 is made of a material of high light transmittance. In an example, the light transmittance of the transparent material layer 111 of the first base substrate 11 may be greater than 90%. Further, the material of the transparent material layer 111 of the first base substrate 11 may include at least one of PET (polyethylene terephthalate) or PC (polycarbonate). The light transmittance of each of PET and PC is 92%, which may make the light transmittance of the first base substrate 11 to be high.

In order to guarantee that the brightness of the second display region B is high when the display panel 100 is operating, the light transmittance of the second display region B needs to be low to reduce the brightness loss of the second display region B. The light transmittance of the second base substrate 12 of the second display region B may ranges from 30% to 60%, so as to reduce the light transmittance of the second display region B, and to increase the brightness of the second display region B during display.

The material of the organic layer of the second base substrate 12 may be PI (polyimide). A refractive index of PI is not much different from those of PET and PC, and thus the first base substrate 11 and the second base substrate 12 have approximate refractive indexes, so that it may avoid a greater difference of the display effect between the first display region A and the second display region B resulting from the difference of the refractive indexes between the first base substrate 11 and the second base substrate 12, which makes the overall display effect of the display panel 100 to be more uniform. The material of the inorganic layer of the second base substrate 12 may be $SiO_2$, SiNx, or the like.

Further, the first base substrate 11 further includes a stack structure 112 in which one or more organic layers and one or more inorganic layers are alternately laminated. The stack structure 112 of the first base substrate 11 and the stack structure of the second base substrate 12 share a part of the film layers. In an example, the organic layer of the first base substrate 11 and the organic layer of the second base substrate 12 which are disposed in the same layer share the same film layer. And the inorganic layer of the first base substrate and the inorganic layer of the second base substrate 12 which are disposed in the same layer share the same film layer.

Referring to FIG. 4 again, the stack structure 112 of the first base substrate 11 may include a first organic layer 113 and a first inorganic layer 114 disposed on the first organic layer 113. And the stack structure of the second base substrate 12 includes a second organic layer 121, a second inorganic layer 122, a third organic layer 123, and a third inorganic layer 124 that are sequentially and alternately laminated from bottom to top. The first organic layer 113 and a part of the third organic layer 123 share the same film layer, and the first inorganic layer 114 and the third inorganic layer 124 share the same film layer. A thickness of the first organic layer 113 is less than a thickness of the third organic layer 123, and a thickness of the first inorganic layer 114 is equal to a thickness of the third inorganic layer 124. The first inorganic layer 114 and the third inorganic layer 124 sharing the same film layer means that the first inorganic layer and the third inorganic layer are formed of the same material through a single process step. The first organic layer 113 and a part of the third organic layer 123 sharing the same film layer means that the first organic layer and the third organic layer are formed of the same material at the same time. When forming the first organic layer 113 and the third organic layer 123, an organic layer with uniform thickness may be formed at the same time, and then a portion of the organic layer located in the first display region A is partially etched away, thereby forming the first organic layer 113 and the third organic layer 123.

The transparent material layer 111 of the first base substrate 11 may be disposed beneath the stack structure 112 of the first base substrate 11, and a bottom surface of the transparent material layer 111 of the first base substrate 11 is flush with a bottom surface of the second base substrate 12. Furthermore, if a top surface of the stack structure 112 of the first base substrate 11 is flush with a top surface of the second base substrate 12, then the overall thickness of the first base substrate 11 is the same as the overall thickness of the second base substrate 12, so that it facilitates the display panel 100 to have a substantially uniform thickness, and facilitates the display panel 100 to have an aesthetics appearance.

In an embodiment, referring to FIG. 4 again, a protective layer 5 is disposed beneath the first base substrate 11, beneath the second base substrate 12, as well as between a side surface of the transparent material layer 111 of the first base substrate 11 and the second base substrate, and/or the protective layer 5 is disposed between the top of the transparent material layer 111 of the first base substrate 11 and the stack structure 112 of the first base substrate 11. The protective layer 5 may protect the first base substrate 11 and the second base substrate 12 so as to improve the mechanical strength of the display panel, thereby increasing the service life of the display panel 100.

The material of the protective layer 5 may include at least one of IZO, ITO, SiNx, or SiOx. The above materials may make the light transmittance of the protective layer 5 to be high, and prevent the protective layer 5 from affecting the light transmittance of the first display region A.

In an embodiment, a buffer layer 8 may be disposed between the base substrate 1 and the driving circuit layer 2. The material of the buffer layer 8 may be SiNx or SiOx. The buffer layer 8 may improve the bonding between the base substrate 1 and the driving circuit layer 2, so as to avoid separation of the base substrate 1 and the driving circuit layer 2, and further improve the service life of the display panel 100.

In the display panel 100 according to the embodiment of the present disclosure, the driving mode for the first display region A may be passive or active. When the driving mode for the first display region A is passive, the first display region A is a display region of Passive-Matrix Organic Light Emitting Diode (PMOLED); when the driving mode of the first display region A is active, the first display region A is a display region of Active-Matrix Organic Light Emitting Diode (AMOLED). The driving mode of the second display region B is active, and the second display region is an AMOLED display region.

FIG. 3 is a cross-sectional view of the first display region A and a part of the second display region B in the display panel 100 taken along line 2-2 in FIG. 1. Referring to FIG. 3, a part of the driving circuit layer 2 which is located in the second display region B may include a gate insulating layer 24, a capacitor insulating layer 25 on the gate insulating layer 24, an interlayer dielectric layer 26 on the capacitor insulating layer 25, a planarization layer 27 on the interlayer dielectric layer 26, an anode layer 23 on the planarization layer 27, and transistors (not shown) and storage capacitors (not shown) provided between the film layers. The anode layer 23 may be a sandwich structure in which a film layer of Ag is provided between two indium tin oxide film layers.

When the first display region A is a PMOLED display region, the structure of the part of the driving circuit layer 2 which is located in the first display region A may be one of the followings.

In a first implementation, referring to FIG. 3, the part of the driving circuit layer 2 which is located in the first display region A includes a gate insulating layer 24, a capacitor insulating layer 25 on the gate insulating layer 24, an interlayer dielectric layer 26 on the capacitor insulating layer 25, a planarization layer 27 on the interlayer dielectric layer 26, and an anode layer 21 on the planarization layer 27. The gate insulating layer 24, the capacitor insulating layer 25, the interlayer dielectric layer 26, the planarization layer 27, and the anode layer located on the planarization layer 27 in the first display region A are located at the same layer as the respective corresponding film layers in the second display region B respectively, and are formed with the corresponding film layer in the second display region B through a single process respectively. The anode layer 21 may be a single film layer made of transparent material. Further, the light transmittance of the transparent material of the anode layer 21 is greater than or equal to 90%. In an example, the transparent material is indium tin oxide, indium zinc oxide, indium tin oxide doped with silver or indium zinc oxide doped with silver. In this way, the light transmittance of the anode layer 21 of the first display region A may be high, and the light transmittance of the first display region A can be improved.

In a second implementation, the part of the driving circuit layer 2 which is located in the first display region A may only include the anode layer 21 without other film layers, so that the driving circuit layer of the first display region A may have high light transmittance. The anode layer 21 may be a single film structure made of transparent material. Further, the light transmittance of the transparent material for fabricating the anode layer 21 is greater than or equal to 90%. In an example, the transparent material is indium tin oxide, indium zinc oxide, indium tin oxide doped with silver or indium zinc oxide doped with silver.

Figure 5:
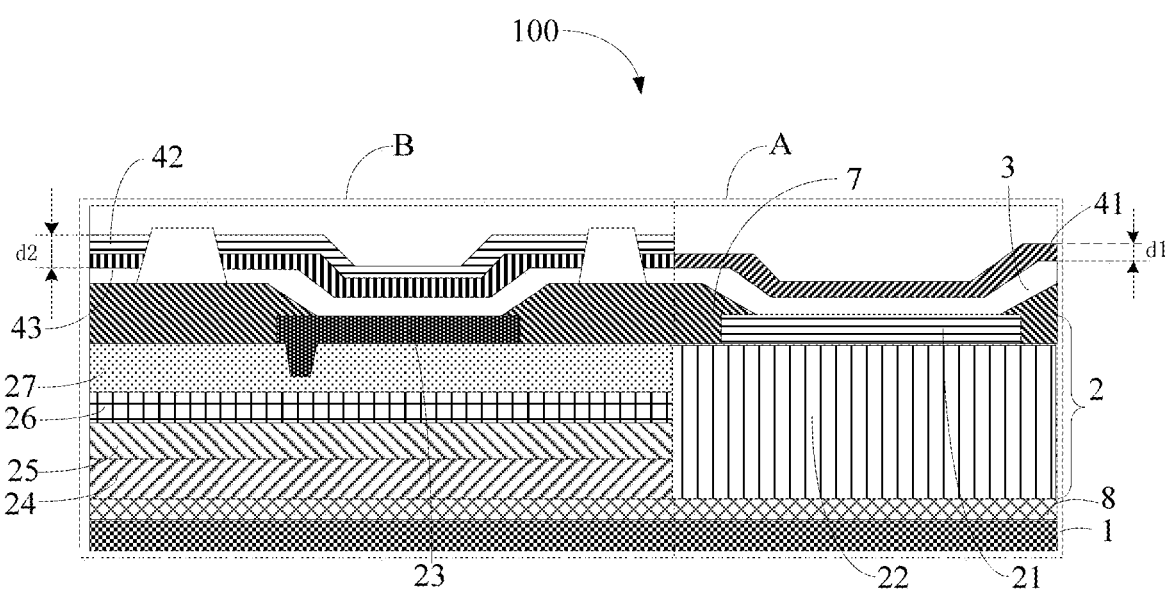
FIG. 5 is a partial cross-sectional view of another display panel.

In a third implementation, referring to FIG. 5 (FIG. 5 is a cross-sectional view of the first display region A and a part of the second display region B in the display panel 100 taken along line 2-2 in FIG. 1), the part of the driving circuit layer 2 which is located in the first display region A may include the anode layer 21 and a transparent organic film layer 22 disposed beneath the anode layer 21. The transparent organic film layer 22 and the anode layer 21 may be made of transparent material, and the anode layer 21 may be a single film layer structure made of transparent material. Further, the light transmittance of both the transparent organic film layer 22 and the anode layer 21 is both greater than 90%. In an example, the transparent material for fabricating the anode layer 21 is indium tin oxide, indium zinc oxide, indium tin oxide doped with silver, or indium zinc oxide doped with silver. The material for the transparent organic film layer 22 may be PET, PC, or the like. Furthermore, the total thickness of insulating layers of the second display region B (that is, the gate insulating layer 24, the capacitor insulating layer 25, the interlayer dielectric layer 26, and the planarization layer 27 of the second display region B) is equal to a thickness of the transparent organic film layer 22 of the first display region A, so that the part of the driving circuit layer 2 which is located in the first display region A and the part of the driving circuit layer 2 which is located in the second display region B have the same thickness, which facilitates the display panel 100 to have a substantially uniform thickness, thereby improving the aesthetic appearance of the display panel 100.

When the first display region A is an AMOLED display region, the part of the driving circuit layer 2 which is located in the first display region A is provided with a plurality of transistors and a plurality of storage capacitors. The plurality of transistors and the plurality of storage capacitors constitute a plurality of first driving circuit units which are configured to drive the organic light emitting material of the light emitting functional film layer 3 to emit light, so that the first display region A displays.

The second display region B is an AMOLED display region. The part of the driving circuit layer 2 which is located in the second display region B is provided with a plurality of transistors and a plurality of storage capacitors. The plurality of transistors and the plurality of storage capacitors constitute a plurality of second driving circuit units which are configured to drive the organic light emitting material of the light emitting functional film layer 3 to emit light, so that the second display region B displays.

In one embodiment, the number of transistors of the first driving circuit unit is less than or equal to the number of transistors of the second driving circuit unit. Optionally, the first driving circuit unit may be a 2T1C driving circuit (that is, the first driving circuit unit includes two transistors and one storage capacitor). Or the first driving circuit unit may be a 3T1C driving circuit (that is, the first driving circuit unit includes three transistors and one storage capacitor). The second driving circuit unit may be, for example, a 7T1C circuit (that is, the second driving circuit unit includes seven transistors and one storage capacitor), a 5T1C circuit (that is, the second driving circuit unit includes five transistors and one storage capacitor), a 4T1C circuit (that is, the second driving circuit unit includes four transistors and one storage capacitor) and so on. With such arrangements, the structure of the first driving circuit unit is less complex than the structure of the second driving circuit unit, so that the area of the conductive layer in the part of the driving circuit layer 2 which is located in the first display region A is small, which can further improve the light transmittance of the first display region A.

Figure 6:
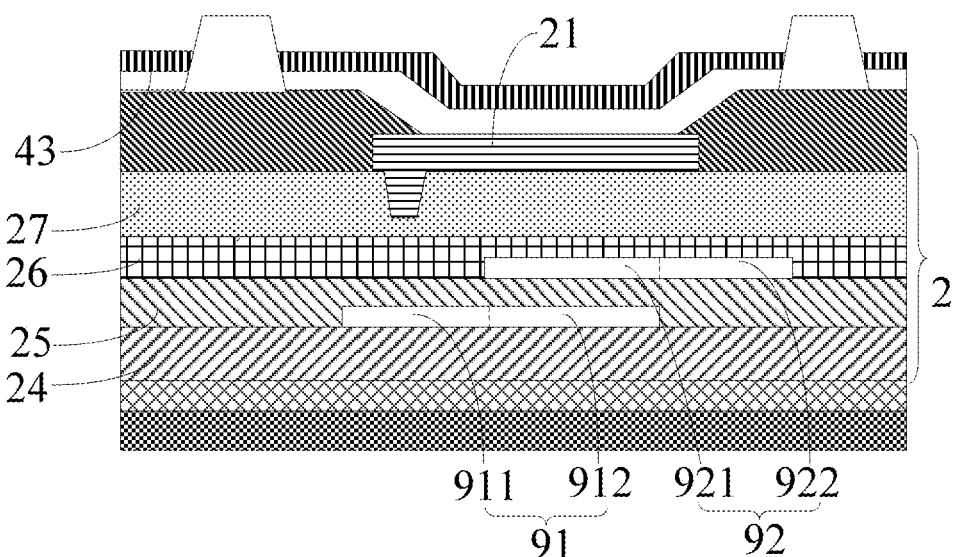
FIG. 6 is a cross-sectional view of a first display area of a display panel according to an embodiment of the present disclosure.
Figure 8:
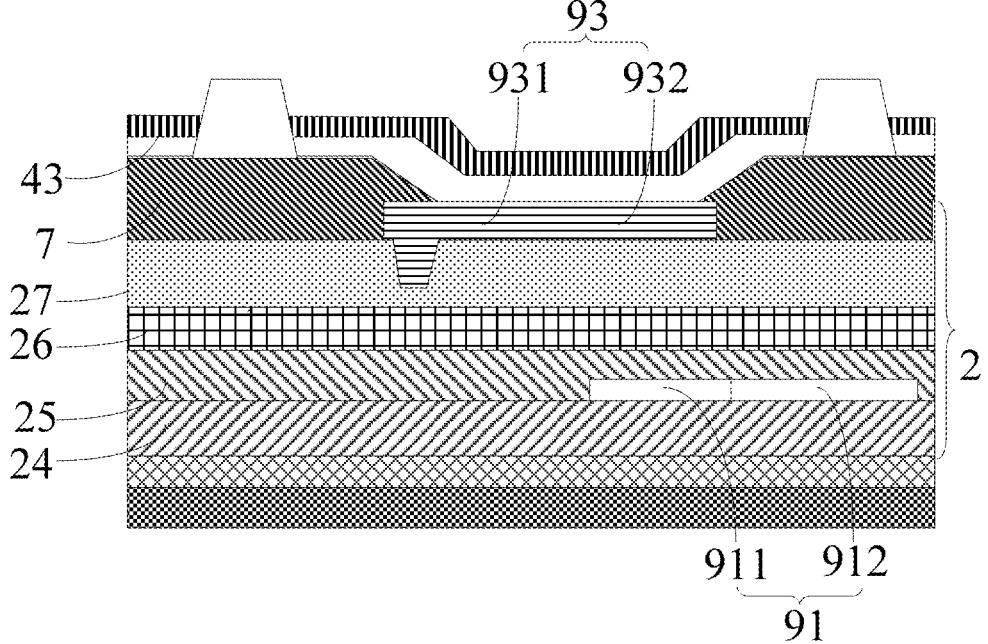
FIG. 8 is a cross-sectional view of a first display area of another display panel according to an embodiment of the present disclosure.

The transistors of the first driving circuit unit may include a first transistor, and the storage capacitor of the first driving circuit unit includes a first electrode plate and a second electrode plate. Referring to FIGS. 6 and 8, the part of the driving circuit layer 2 which is located in the first display region A includes a gate insulating layer 24, a capacitor insulating layer 25 on the gate insulating layer 24, and an interlayer dielectric layer 26 on the capacitor insulating layer 25, a planarization layer 27 on the interlayer dielectric layer 26, as well as a first conductive layer 91 disposed between the gate insulating layer 24 and the capacitor insulating layer 25. A part 912 of the first conductive layer 91 is performed as the first electrode plate of the storage capacitor and another part 911 is performed as a gate electrode of the first transistor. With such an arrangement, when the gate electrode of the first transistor, the first electrode plate of the storage capacitor as well as a connection therebetween may be completed through a single process step, and there is no need to fabricate a connection structure therebetween after the gate electrode of the first transistor and the first electrode plate of the storage capacitor are formed. In this way, the manufacturing process of the first driving circuit unit can be simplified. The first electrode plate may be the lower electrode plate of the storage capacitor, and the second electrode plate may be the upper electrode plate of the storage capacitor.

When the first driving circuit unit is a 2T1C driving circuit, the part of the driving circuit layer in the first display region further includes a power supply line, a data line, a scan line, and anode layers in one to one correspondence with the plurality of first driving circuit units. As illustrated in FIG. 6, the part of the driving circuit layer 2 which is located in the first display region includes second conductive layers 92, and anode layers 21 on the planarization layer 27 and corresponding to the first driving circuit units in one-to-one manner. A part 921 of the second conductive layer 92 is performed as the second electrode plate of the storage capacitor, and another part 922 is performed as a power supply line. With such an arrangement, the power supply line, the second electrode plate of the storage capacitor and the connection therebetween can be completed through a single process step, and there is no need to fabricate the connection therebetween after the power supply line and the second electrode plate of the storage capacitor are formed. In this way, the manufacturing process of the first driving circuit unit can be simplified.

In addition to the first conductive layer 91, the second conductive layer 92, and the anode layer 21 illustrated in FIG. 6, the part of the driving circuit layer 2 which is located in the first display region A further includes a data line, a scan line, source and drain electrodes of the first transistor, as well as gate, source and drain electrodes of the second transistor, which are not illustrated in FIG. 6.

Figure 7:
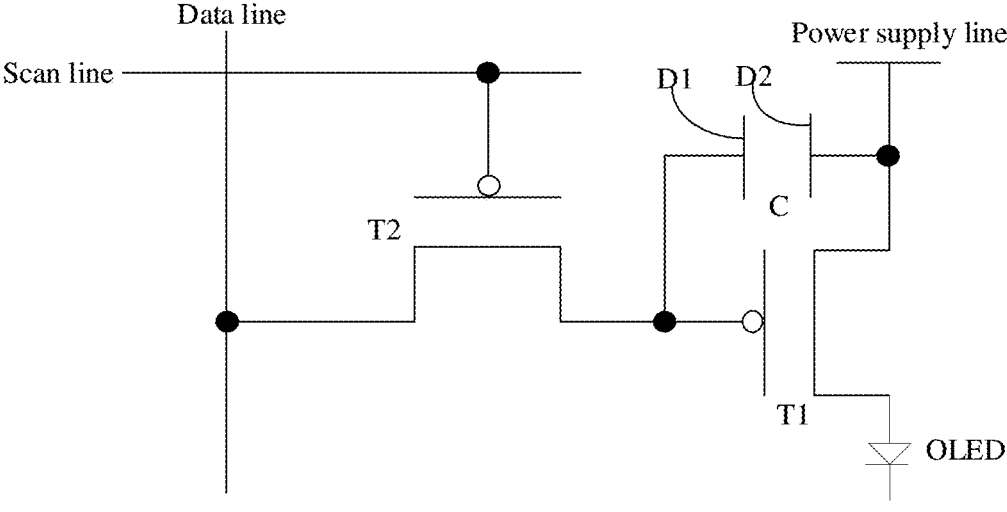
FIG. 7 is a circuit schematic diagram of a first driving circuit unit according to an embodiment of the present disclosure.

When the first driving circuit unit is a 2T1C driving circuit, the schematic circuit diagram is as illustrated in FIG. 7. The transistors of the first driving circuit unit include a first transistor T1 and a second transistor T2. The source electrode of the first transistor T1 and the second electrode plate D2 of the storage capacitor C are respectively connected to a power supply line, the drain electrode of the first transistor T1 is connected to an anode layer of a corresponding OLED (Organic Light Emitting Diode), and the gate electrode of the first transistor is connected to the first electrode plate D1 of the storage capacitor C. The gate electrode of the second transistor T2 is connected to the scan line, the drain electrode of the second transistor T2 is connected to the first electrode plate D1 of the storage capacitor C and the gate electrode of the first transistor T1, respectively, and the source electrode of the second transistor T2 is connected to the data line.

Since the drain electrode of the second transistor T2 is connected to the first electrode plate D1 of the storage capacitor C and the gate electrode of the first transistor T1, respectively, with a part of the first conductive layer being performed as the first electrode plate D1 of the storage capacitor C as well as another part of the first conductive layer being performed as the gate electrode of the first transistor T1, the drain electrode of the second transistor T2 is directly connected to the first conductive layer in terms of configuration. Since the source electrode of the first transistor T1 is connected to the second electrode plate D2 of the storage capacitor C and the power supply line, with a part of the second conductive layer being performed as the second electrode plate D2 of the storage capacitor C as well as another part of the second conductive layer being performed as the power supply line, the source electrode of the first transistor T1 is connected to the second conductive layer in terms of configuration.

In one embodiment, the material of the first transistor T1, the second transistor T2, the storage capacitor C, the data line, the scan line, and the anode layer may be made of transparent material. In an example, the light transmittance of the transparent material is greater than or equal to 90%. Further, the transparent material is indium tin oxide, indium zinc oxide, indium tin oxide doped with silver or indium zinc oxide doped with silver. In this way, the light transmittance of the driving circuit layer in the first display region A can be high, and thus the light transmittance in the first display region A can be improved.

When the first driving circuit unit is a 3T1C driving circuit, the driving circuit layer located in the first display region A further includes a power supply line, a data line, a first scan line, a second scan line, a reference potential line, and anode layers corresponding to the plurality of first driving circuit units in one-to-one manner. As illustrated in FIG. 8, the part of the driving circuit layer 2 which is located in the first display region includes the first conductive layer 91 and a third conductive layer 93 which is on the planarization layer 27. A part 932 of the third conductive layer 93 is performed as the second electrode plate, and another part 931 is performed as a corresponding anode layer. With such an arrangement, the anode layer, the second electrode plate of the storage capacitor and the connection therebetween can be completed through a single process step, and there is no need to fabricate a connection therebetween after the anode layer and the second electrode plate of the storage capacitor are formed. The manufacturing process of the first driving circuit unit can be simplified.

In addition to the first conductive layer 91 and the third conductive layer 93 illustrated in FIG. 8, the part of the driving circuit layer 2 which is located in the first display region further includes a power supply line, a data line, a first scan line, a second scan line, a reference potential line, source and drain electrodes of the first transistor, gate, source and drain electrodes of the third transistor, as well as gate, source and drain electrodes of the fourth transistor, which are not shown in FIG. 8.

Figure 9:
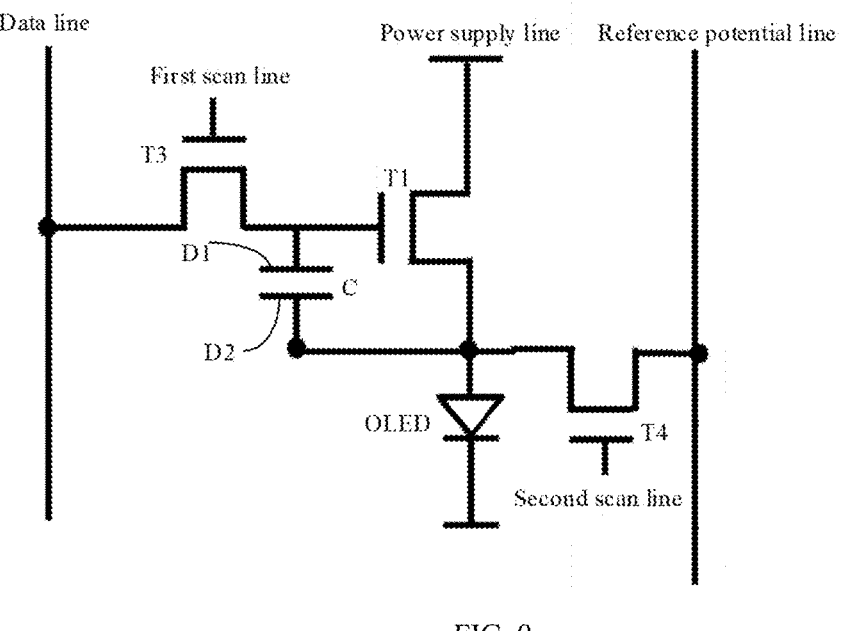
FIG. 9 is another circuit schematic diagram of a first driving circuit unit according to an embodiment of the present disclosure.

When the first driving circuit unit is a 3T1C driving circuit, the schematic circuit diagram is as illustrated in FIG. 9. The transistors of the first driving circuit unit include a first transistor T1, a third transistor T3, and a fourth transistor T4. The source electrode of the third transistor T3 is connected to the data line, the gate electrode of the third transistor T3 is connected to the first scan line, and the drain electrode of the third transistor T3 is connected to the first electrode plate D1 of the storage capacitor C and the gate electrode of the first transistor T1, respectively. The drain electrode of the first transistor T1 is connected to the power supply line, and the source electrode of the first transistor T1 is connected to an anode layer of an OLED and the second electrode plate D2 of the storage capacitor C, respectively. The gate electrode of the fourth transistor T4 is connected to the second scan line, the source electrode of the fourth transistor T4 is connected to the reference potential line, and the drain electrode of the fourth transistor T4 is connected to the anode layer of the OLED.

Since the drain electrode of the third transistor T3 is connected to the first electrode plate of the storage capacitor C and the gate electrode of the first transistor T1, respectively, with a part of the first conductive layer being performed as the first electrode plate of the storage capacitor C as well as another part being performed as the gate electrode of the first transistor T1, the drain electrode of the third transistor T3 is connected to the first conductive layer in terms of configuration. Since the source electrode of the first transistor T1 is connected to the anode layer and the second electrode plate D2 of the storage capacitor C, respectively, and the drain electrode of the fourth transistor T4 is connected to the anode layer, with a part of the third conductive layer being performed as the second electrode plates D2 of the storage capacitors C as well as another part being performed as the corresponding anode layer, in terms of configuration, the source electrode of the first transistor T1 and the drain electrode of the fourth transistor T4 are respectively connected to the third conductive layer.

In one embodiment, the first transistor T1, the third transistor T3, the fourth transistor T4, the storage capacitor C, the data line, the first scan line, the second scan line, the reference potential line and the anode layer of the first driving circuit unit are all made of transparent material. In an example, the light transmittance of the transparent material is greater than or equal to 90%. Further, the transparent material is indium tin oxide, indium zinc oxide, indium tin oxide doped with silver or indium zinc oxide doped with silver. In this way, the light transmittance of the driving circuit layer of the first display region A can be high, and thus the light transmittance of the first display region A can be improved.

Figure 10:
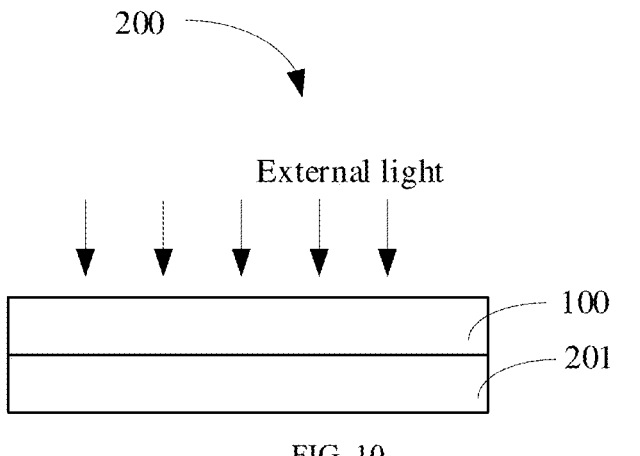
FIG. 10 is a side view of a display device according to an embodiment of the present disclosure.
Figure 11:
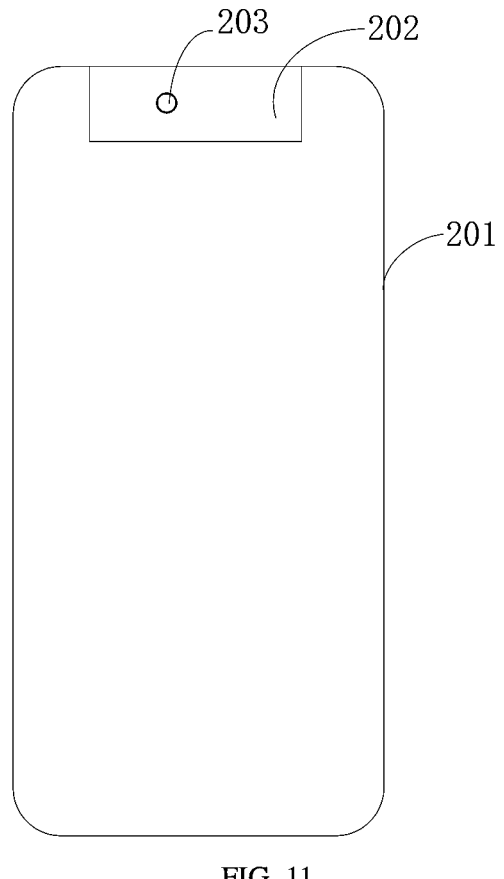
FIG. 11 is a schematic structural view of a device body of the display device illustrated in FIG. 10.

An embodiment of the present disclosure further provides a display device 200. As illustrated in FIG. 10, the display device 200 includes a device body 201 and the display panel 100 mentioned above. As illustrated in FIG. 11, the device body 201 includes a component region 202, and the display panel 100 covers the device body 201. The component region 202 is located beneath the first display region of the display panel 100, and the component region 202 is provided with a light sensing element 203 that collects light through the first display region of the display panel 100.

The light sensing element 203 may include a camera and/or a light sensor. In the component region 403, other elements in addition to the light sensing element 203, such as a gyroscope or an earpiece, may further be provided.

The component region 202 may be a notched region, and the first display region of the display panel 100 may be arranged corresponding to the notched region, so that the light sensing element 203 may collect external light through the first display region and perform other operations.

The above-mentioned display device 200 includes the display panel 100 in which the thickness of the conductive layer in the first display region is smaller than the thickness of the conductive layer in the second display region, so that the light transmittance of the first display region is greater than the light transmittance of the second display region, thereby enabling the light sensing element disposed beneath the first display region to receive enough light to guarantee the light sensing element to operate properly.

The above-mentioned electronic device such as the display device may be a digital device such as a mobile phone, a tablet PC, a palmtop computer, an ipad, an ipod, or the like.

Figure 12:
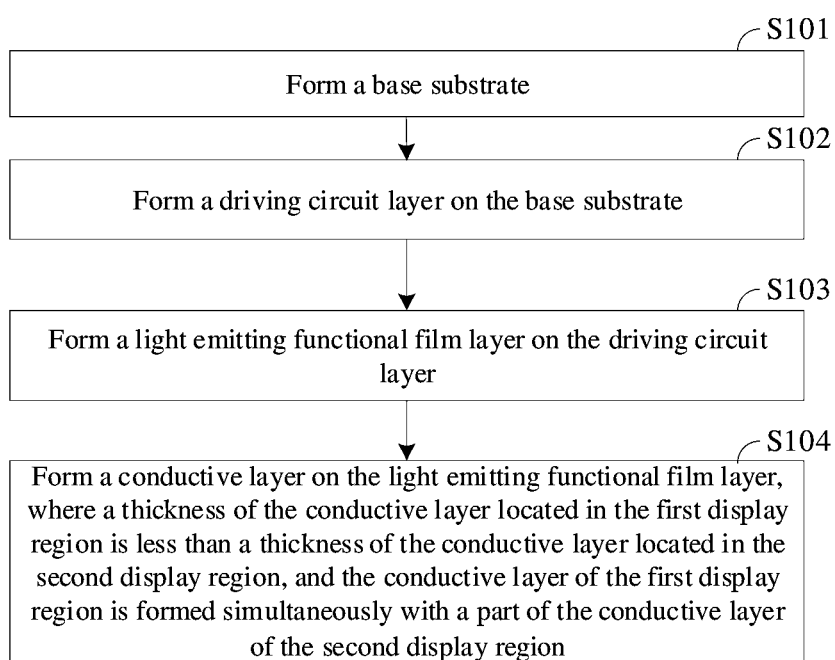
FIG. 12 is a flowchart of a method of manufacturing a display panel according to an embodiment of the present disclosure.

Embodiments of the present disclosure further provide a method of manufacturing a display panel. The display panel includes a first display region and a second display region. The manufacturing method includes the following steps 101 to 104, as illustrated in FIG. 12.

At step 101, a base substrate is formed.

The base substrate may be a flexible base substrate or a rigid base substrate. The rigid base substrate may be a transparent base substrate such as a glass substrate, a quartz base substrate, or a plastic base substrate.

Figure 13:
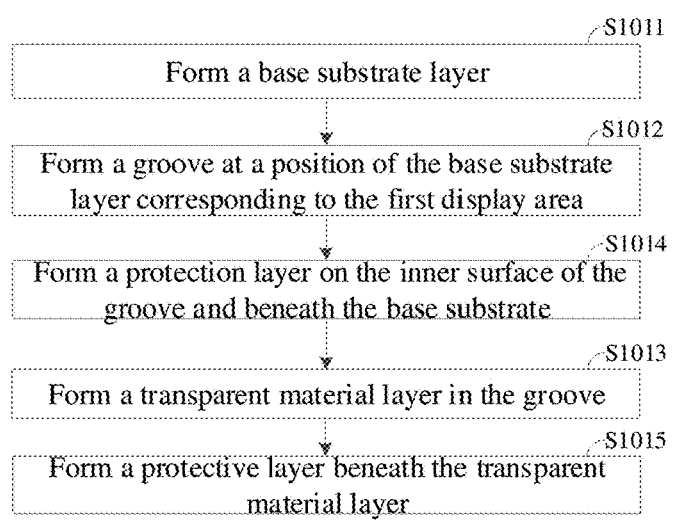
FIG. 13 is a flowchart of a method of forming a base substrate in FIG. 12.

When the base substrate is a flexible base substrate, the step 101 of forming the base substrate may include the following steps 1011 to 1015, as illustrated in FIG. 13.

At step 1011, a base substrate layer is formed.

Figure 14:
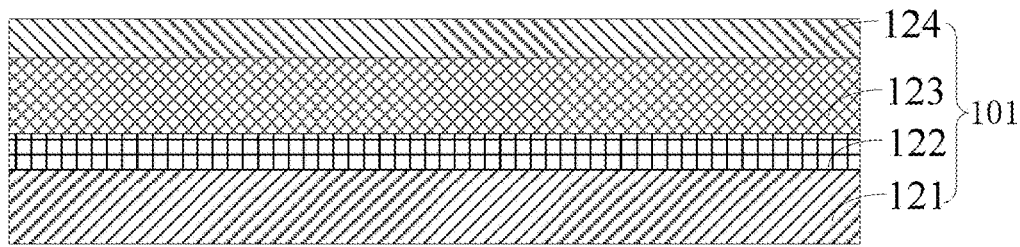
FIG. 14 is a schematic structural diagram of a base substrate layer according to an embodiment of the present disclosure.

The base substrate layer may be a stack structure in which one or more organic layers and one or more inorganic layers are alternately laminated. As illustrated in FIG. 14, the base substrate layer 101 includes a second organic layer 121, a second inorganic layer 122, a third organic layer 123, and a third inorganic layer 124 that are sequentially and alternately laminated from bottom to top.

At step 1012, a groove is formed at a position of the base substrate layer corresponding to the first display region.

Figure 15:
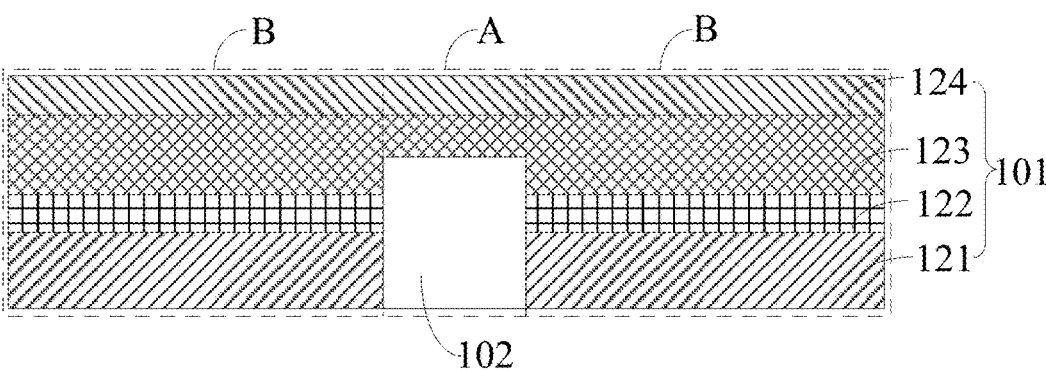
FIG. 15 is a schematic structural diagram of a first intermediate structure according to an embodiment of the present disclosure.

A first intermediate structure may be obtained through step 1012. FIG. 15 is a schematic structural diagram of the first intermediate structure. As illustrated in FIG. 15, a groove 102 is formed at a bottom portion of the base substrate layer 101. An etching process may be used to etch away the second organic layer 121, the second inorganic layer 122 and a part of the third organic layer 123 of a certain thickness thereof which are located in the first display region A, so as to form the groove 102.

At step 1013, a transparent material layer is formed in the groove.

The light transmittance of the transparent material layer may be greater than 90%. Further, the material of the transparent material layer may include at least one of PET or PC.

Figure 16:
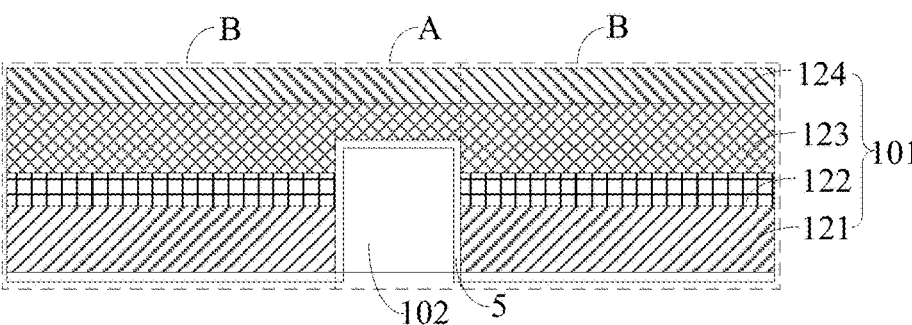
FIG. 16 is a schematic structural diagram of a second intermediate structure according to an embodiment of the present disclosure.

In one embodiment, before the step 1013 of forming the transparent material layer in the groove, the manufacturing method may further include a step 1014: forming a protection layer on the inner surface of the groove and beneath the base substrate layer. Through this step, a second intermediate structure may be obtained. FIG. 16 is a schematic structural diagram of the second intermediate structure. The protective layer 5 is formed on the inner surface of the groove 102 and beneath the part of the base substrate layer 101 which is located in the second display region B.

Step 1013 can be implemented on the basis of the second intermediate structure, and a transparent material layer 111 may be formed in the groove 102 on the basis of the second intermediate structure to obtain a third intermediate structure. FIG. 17 is a schematic structural diagram of the third intermediate structure.

Further, after step 1013 of forming the transparent material layer in the groove, the manufacturing method may further include step 1015: forming a protective layer beneath the transparent material layer.

At this step, the protective layer 5 is formed beneath the transparent material layer 111 on the basis of the third intermediate structure, so as to obtain the structure illustrated in FIG. 4, that is, to obtain the base substrate 1.

The bottom surface of the transparent material layer 111 may be flush with the bottom surface of the part of the base substrate layer which is located in the second display region B, so that a portion of the base substrate which is located in the first display region A and a portion of the base substrate which is located in the second display region B have the same thickness.

At step 102, a driving circuit layer is formed on the base substrate.

At step 103, a light emitting functional film layer is formed on the driving circuit layer.

At step 104, a conductive layer is formed on the light emitting functional film layer, where a thickness of the conductive layer located in the first display region is less than a thickness of the conductive layer located in the second display region, and the conductive layer of the first display region is formed simultaneously with a part of the conductive layer of the second display region.

In one embodiment, as illustrated in FIG. 18, the step 104 of forming the conductive layer on the light emitting functional film layer may be completed through the following steps 1041 and 1042.

At step 1041, a first conductive film layer is formed on the light emitting functional film layer, and the first conductive film layer covers the first display region and the second display region.

A fourth intermediate structure may be obtained through step 1041. FIG. 19 is a schematic structural diagram of the fourth intermediate structure. As illustrated in FIG. 19, the driving circuit layer 2 is formed on the base substrate 1, and the light emitting functional film layer 3 is formed on the driving circuit layer 2, where A denotes a first display region, and B denotes a second display region. The first conductive film layer 401 is formed on the light emitting functional film layer 3, and the first conductive film layer 401 covers the light emitting functional film layer 3 located in both of the first display region A and the second display region B.

The material of the first conductive film layer 401 may be indium tin oxide, indium zinc oxide, indium tin oxide doped with silver, or indium zinc oxide doped with silver. Alternatively, the material of the first conductive film layer 401 includes at least one of Mg or Ag. Preferably, the material of the first conductive film layer 401 includes Mg and Ag, and the mass ratio of Mg to Ag ranges from 1:4 to 1:20.

At step 1042, a second conductive film layer is formed on the first conductive film layer, and the second conductive film layer is only disposed in the second display region.

A fifth intermediate structure may be obtained through step 1042. FIG. 20 is a schematic structural diagram of the fifth intermediate structure. The second conductive film layer 402 is only disposed in the second display region B.

Therefore, in the conductive layer 4 obtained through steps 1041 and 1042, a part of the conductive layer 4 which is located in the first display region A only includes the first conductive film layer 401, and a part of the conductive layer 4 which is located in the second display region B includes the first conductive film layer 401 and a second conductive film layer 402.

The material of the second conductive film layer may include at least one of Mg or Ag.

Figure 21:
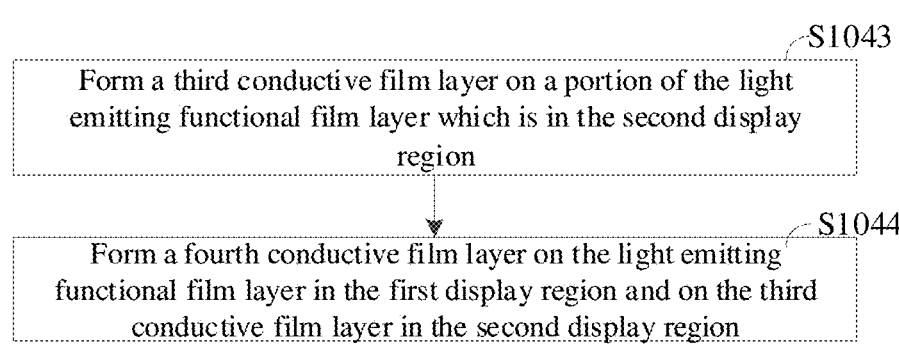
FIG. 21 is a flowchart of another method of forming a conductive layer on a light emitting functional film layer according to an embodiment of the present disclosure.

In another embodiment, as illustrated in FIG. 21, the step 104 of forming the conductive layer on the light emitting functional film layer may be completed by the following steps 1043 and 1044.

At step 1043, a third conductive film layer is formed on a portion of the light emitting functional film layer located in the second display region.

Figure 22:
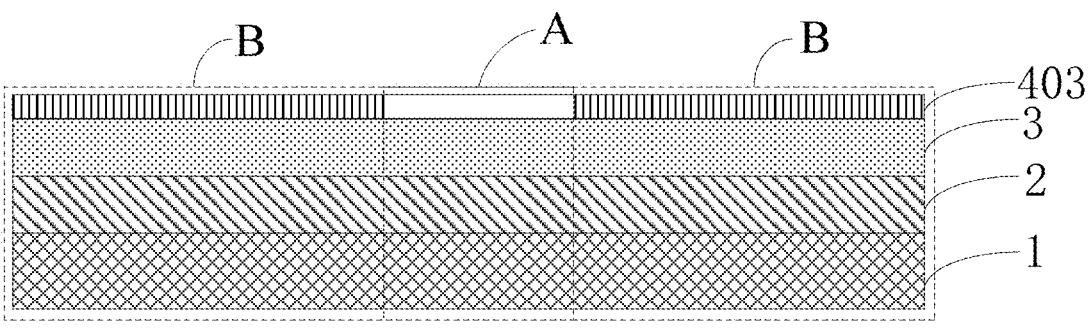
FIG. 22 is a schematic structural diagram of a sixth intermediate structure according to an embodiment of the present disclosure.

A sixth intermediate structure may be obtained through step 1043. FIG. 22 is a schematic structural diagram of the sixth intermediate structure. As illustrated in FIG. 22, the driving circuit layer 2 is formed on the base substrate 1, and the light emitting functional film layer 3 is formed on the driving circuit layer 2, where A denotes the first display region, and B denotes the second display region. The third conductive film layer 403 is formed on the light emitting functional film layer 3 and covers only the second display region B.

The third conductive film layer 403 may have the same thickness as the second conductive film layer 402, and the material of the third conductive film layer 403 may be the same as the material of the second conductive film layer 402, which includes at least one of Mg or Ag.

At step 1044, a fourth conductive film layer is formed on the light emitting functional film layer in the first display region and on the third conductive film layer in the second display region.

Figure 23:
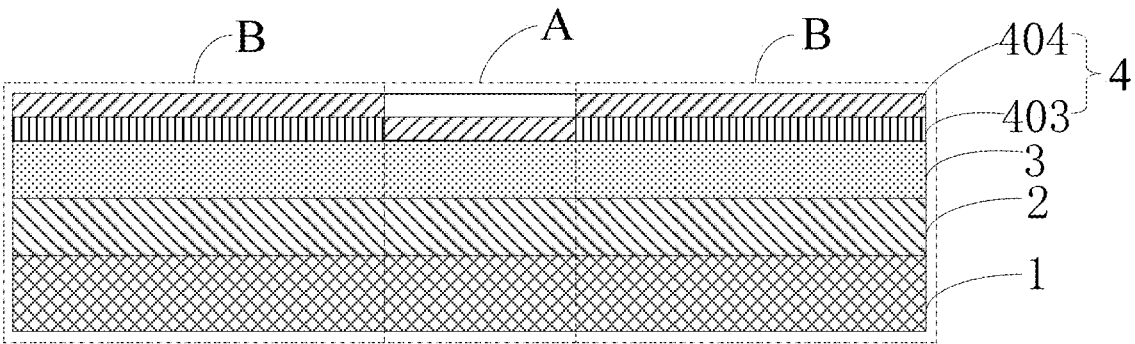
FIG. 23 is a schematic structural diagram of a seventh intermediate structure according to an embodiment of the present disclosure.

A seventh intermediate structure may be obtained through step 1044, and a schematic structural diagram of the seventh intermediate structure is illustrated in FIG. 23. As illustrated in FIG. 23, the fourth conductive film layer 404 covers the light emitting functional film layer 3 in the first display region A and the third conductive film layer 403 in the second display region B.

Therefore, in the conductive layer 4 obtained through steps 1043 and 1044, a part of the conductive layer 4 which is located in the first display region A only includes the fourth conductive film layer 404, and a part of the conductive layer 4 which is located in the second display region B includes the third conductive film layers 403 and the fourth conductive film layer 404.

The material of the fourth conductive film layer 404 may be indium tin oxide, indium zinc oxide, indium tin oxide doped with silver, or indium zinc oxide doped with silver. Alternatively, the material of the fourth conductive film layer 404 includes at least one of Mg or Ag. Preferably, the material of the third conductive film layer 403 includes both Mg and Ag, and the mass ratio of Mg to Ag ranges from 1:4 to 1:20. The thickness of the fourth conductive film layer 404 may be the same as the thickness of the first conductive film layer 401, and the material of the fourth conductive film layer 404 may be the same as the material of the first conductive film layer 401.

In the display panel manufactured by the manufacturing method according to the embodiments of the present disclosure, the thickness of the conductive layer located in the first display region is less than the thickness of the conductive layer located in the second display region, so that the light transmittance of the first display region is greater than the light transmittance of the second display region, thereby enabling the light sensing element disposed beneath the first display region to receive enough light to guarantee the light sensing element to operate properly.

Both the display panel manufactured by the above manufacturing method and the display panel 100 according to the above embodiment pertain to a same inventive concept. For details, reference may be made to the above embodiments of the display panel 100, details of which will not be elaborated herein.

Figure 24:
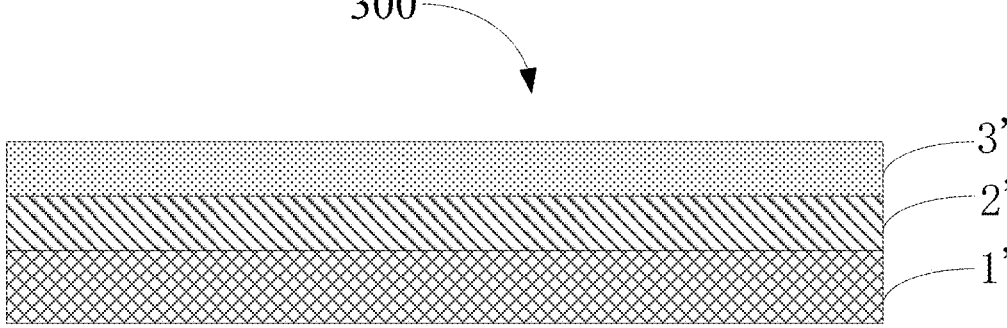
FIG. 24 is a schematic structural diagram of a transparent OLED substrate according to an embodiment of the present disclosure.
Figure 25:
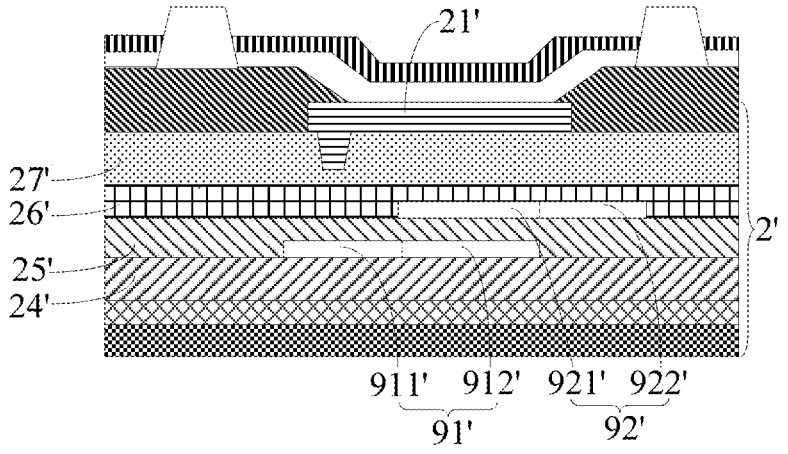
FIG. 25 is a cross-sectional view of a transparent OLED substrate according to an embodiment of the present disclosure.
Figure 26:
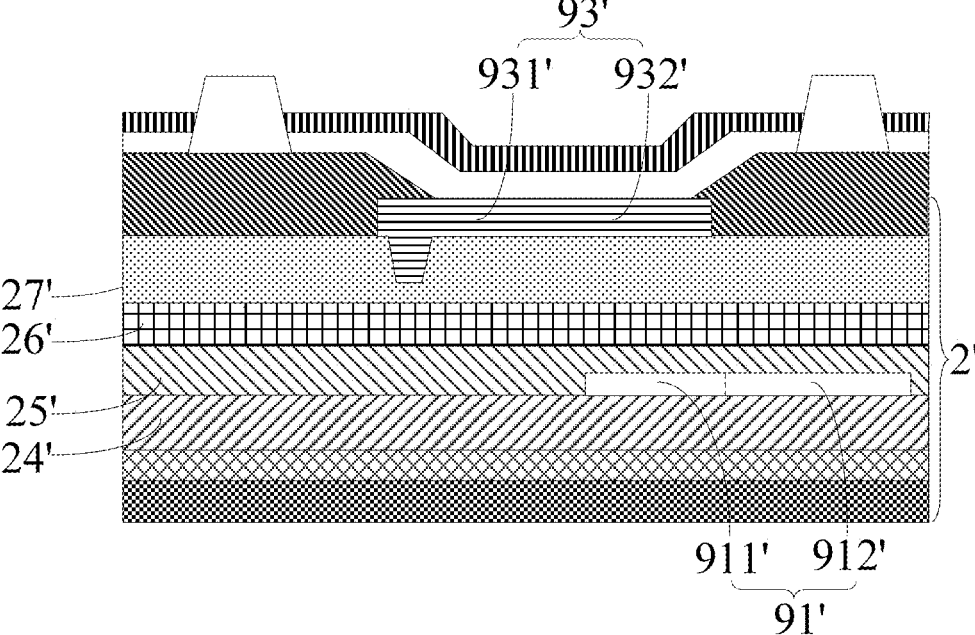
FIG. 26 is another cross-sectional view of a transparent OLED substrate according to an embodiment of the present disclosure.

Embodiments of the present disclosure further provide an array substrate including a transparent OLED substrate 300. As illustrated in FIG. 24, the transparent OLED substrate 300 includes a base substrate 1', a driving circuit layer 2' formed on the base substrate 1' and a light emitting functional film layer 3' formed on the driving circuit layer 2'. The driving circuit layer 2' includes a plurality of first driving circuit units. The first driving circuit unit includes a storage capacitor and a first transistor. And the storage capacitor includes a first electrode plate and a second electrode plate. Referring to FIGS. 25 and 26, the first driving circuit unit includes a first conductive layer 91', a part 912' of the first conductive layer 91' is performed as the first electrode plate, and another part 911' thereof is performed as the gate electrode of the first transistor.

In the transparent OLED substrate 300, since a part of the first conductive layer is performed as the first electrode plate and another part is performed as the gate electrode of the first transistor, the gate electrode of the first transistor, the first electrode plate of the storage capacitor as well as the connection therebetween may be completed through a single process step, and there is no need to manufacture the connection structure therebetween after the gate electrode of the first transistor and the first electrode plate of the storage capacitor are formed. The manufacturing process of the first driving circuit unit is simplified.

As illustrated in FIGS. 25 and 26, the driving circuit layer 2' of the transparent OLED substrate 300 includes a gate insulating layer 24', a capacitor insulating layer 25' on the gate insulating layer 24', an interlayer dielectric layer 26' on the capacitor insulating layer 25', and a planarization layer 27' on the interlayer dielectric layer 26'. The first conductive layer 91' is disposed between the gate insulating layer 24' and the capacitor insulating layer 25'.

The first driving circuit unit may be a 2T1C driving circuit. When the first driving circuit unit is a 2T1C driving circuit, the driving circuit layer of the transparent OLED substrate 300 may further include a power supply line, a data line, a scan line, and anode layers corresponding to the plurality of first driving circuit units in one-to-one manner. Referring to FIG. 25, the driving circuit layer of the transparent OLED substrate 300 further includes anode layers 21' on the planarization layer 27' and corresponding to the first driving circuit units in a one-to-one manner and second conductive layers 92'. A part 921' of the second conductive layer 92' is performed as the second electrode plate of the storage capacitor, and another part 922' of the second conductive layer 92' is performed as the power supply line. The first driving circuit unit further includes a second transistor. A source electrode of the first transistor is connected to the second conductive layer 92', a drain electrode of the first transistor is connected to a corresponding anode layer, a gate electrode of the second transistor is connected to the scan line, a drain electrode of the second transistor is connected to the first conductive layer respectively, and a source electrode of the second transistor is connected to the data line.

In addition to the first conductive layer 91', the second conductive layer 92', the anode layer 21', the gate insulating layer 24', the capacitor insulating layer 25', the interlayer dielectric layer 26' and the planarization layer 27' illustrated in FIG. 25, the driving circuit layer 2' of the transparent OLED substrate 300 further includes a data line, a scan line, source and drain electrodes of the first transistor, as well as gate, source and drain electrodes of the second transistor, which are not shown in FIG. 25.

When the first driving circuit unit is a 2T1C driving circuit, the circuit diagram is as illustrated in FIG. 7. The transistors of the first driving circuit unit include a first transistor T1 and a second transistor T2. The source electrode of the first transistor T1 and the second electrode plate D2 of the storage capacitor C are respectively connected to a power supply line, the drain electrode of the first transistor T1 is connected to an anode layer of a corresponding OLED, and the gate electrode of the first transistor is connected to the first electrode plate D1 of the storage capacitor C. The gate electrode of the second transistor T2 is connected to the scan line, the drain electrode of the second transistor T2 is connected to the first electrode plate D1 of the storage capacitor C and the gate electrode of the first transistor T1, respectively, and the source electrode of the second transistor T2 is connected to the data line.

Since the drain electrode of the second transistor T2 is connected to the first electrode plate D1 of the storage capacitor C and the gate electrode of the first transistor T1, respectively, with a part of the first conductive layer being performed as the first electrode plate D1 of the storage capacitor C as well as another part of the first conductive layer being performed as the gate electrode of the first transistor T1, the drain electrode of the second transistor T2 is directly connected to the first conductive layer in terms of configuration. Since the source electrode of the first transistor T1 is connected to the second electrode plate D2 of the storage capacitor C and the power supply line, with a part of the second conductive layer being performed as the second electrode plate D2 of the storage capacitor C as well as another part of the second conductive layer being performed as the power supply line, the source electrode of the first transistor T1 is connected to the second conductive layer in terms of configuration The first transistor T1, the second transistor T2, the storage capacitor C, the data line, the scan line, and the anode layer are all made of transparent material. In an example, the light transmittance of the transparent material is greater than or equal to 90%. Further, the transparent material is indium tin oxide, indium zinc oxide, indium tin oxide doped with silver or indium zinc oxide doped with silver. In this way, the light transmittance of the driving circuit layer of the transparent OLED substrate can be high, thereby further improving the light transmittance of the transparent OLED substrate.

The first driving circuit unit may be a 3T1C driving circuit. When the first driving circuit unit is a 3T1C driving circuit, the driving circuit layer may include a power supply line, a data line, a first scan line, a second scan line, a reference potential line, and anode layers corresponding to a plurality of first driving circuit units in one-to-one manner. As illustrated in FIG. 26, the driving circuit layer 2' includes a third conductive layer 93' on the planarization layer 27', a part 932' of the third conductive layer 93' is performed as the second electrode plate, and another part 931' of the third conductive layer 93' is performed as the corresponding anode layer. With such an arrangement, the anode layer, the second electrode plate of the storage capacitor as well as the connection therebetween may be completed through a single process step, and there is no need to fabricate a connection therebetween after the anode layer and the second electrode plate of the storage capacitor are formed. The manufacturing process of the first driving circuit unit can be simplified.

In addition to the first conductive layer 91', the third conductive layer 93', the gate insulating layer 24', and the capacitor insulating layer 25', the interlayer dielectric layer 26' and the planarization layer 27' illustrated in FIG. 26, the driving circuit layer 2' of the transparent OLED substrate further includes a power supply line; a data line; a first scan line; a second scan line; a reference potential line; source and drain electrodes of the first transistor; gate, source and drain electrodes of the third transistor; as well as gate, source and drain electrodes of the fourth transistor, which are not shown in FIG. 26.

When the first driving circuit unit is a 3T1C driving circuit, the schematic circuit diagram is illustrated in FIG. 9. The transistors of the first driving circuit unit include a first transistor T1, a third transistor T3, and a fourth transistor T4. The source electrode of the third transistor T3 is connected to the data line, the gate electrode of the third transistor T3 is connected to the first scan line, and the drain electrode of the third transistor T3 is connected to the first electrode plate D1 of the storage capacitor C and the gate electrode of the first transistor T1, respectively. The drain electrode of the first transistor T1 is connected to the power supply line, and the source electrode of the first transistor T1 is connected to an anode layer of an OLED and the second electrode plate D2 of the storage capacitor C, respectively. The gate electrode of the fourth transistor T4 is connected to the second scan line, the source electrode of the fourth transistor T4 is connected to the reference potential line, and the drain electrode of the fourth transistor T4 is connected to the anode layer of the OLED.

Since the drain electrode of the third transistor T3 is connected to the first electrode plate D1 of the storage capacitor C and the gate electrode of the first transistor T1, respectively, with a part of the first conductive layer being performed as the first electrode plate of the storage capacitor C as well as another part being performed as the gate electrode of the first transistor T1, the drain electrode of the third transistor T3 is connected to the first conductive layer in terms of configuration. Since the source electrode of the first transistor T1 is connected to the anode layer and the second electrode plate D2 of the storage capacitor C, respectively, and the drain electrode of the fourth transistor T4 is connected to the anode layer, with a part of the third conductive layer being performed as the second electrode plates D2 of the storage capacitors C as well as another part being performed as the corresponding anode layer, in terms of configuration, the source electrode of the first transistor T1 and the drain electrode of the fourth transistor T4 are respectively connected to the third conductive layer.

In an example, the first transistor T1, the third transistor T3, the fourth transistor T4, the storage capacitor C, the data line, the first scan line, the second scan line, the reference potential line and the anode layer are all made of transparent material. In an example, the light transmittance of the transparent material is greater than or equal to 90%. Further, the transparent material is indium tin oxide, indium zinc oxide, indium tin oxide doped with silver or indium zinc oxide doped with silver. In this way, the light transmittance of the driving circuit layer in the transparent OLED substrate can be high, thereby further improving the light transmittance of the transparent OLED substrate.

Embodiments of the present disclosure further provide a transparent display panel including the transparent OLED substrate mentioned above and a first encapsulation layer. The first encapsulation layer is disposed on a side of the transparent OLED substrate away from the base substrate.

In the transparent display panel according to the embodiments of the present disclosure, since a part of the first conductive layer of the transparent OLED substrate is performed as the first electrode plate of the storage capacitor, and another part is performed as the gate electrode of the first transistor, the gate electrode of the first transistor, the first electrode plate of the storage capacitor as well as a connection therebetween may be completed in a single step, and there is no need to fabricate a connection structure therebetween after the gate electrode of the first transistor and the first electrode plate of the storage capacitor are formed. In this way, the manufacturing process of the first driving circuit unit can be simplified.

A first encapsulation layer may be a thin-film encapsulation structure, and the thin-film encapsulation structure may include a stack structure in which one or more organic layers and one or more inorganic layers are alternately laminated. Both the organic layers and the inorganic layers are made of transparent material. And the material of the inorganic layers is, for example, $SiO_2$, SiNx, $Al_2O_3$, etc. The material of the organic layers may be, for example, PI, PET, etc. The first encapsulation layer may further be a glass cover or a glass frit encapsulation structure.

Embodiments of the present disclosure further provide an array substrate. The array substrate includes a first OLED substrate and a second OLED substrate. The first OLED substrate includes any transparent OLED substrate mentioned above, and the second OLED substrate is a non-transparent OLED substrate. The first OLED substrate and the second OLED substrate share the same base substrate, and the light emitting functional film layer of the first OLED substrate and the light emitting functional film layer of the second OLED substrate are formed through a single process.

In the array substrate according to the embodiment of the present disclosure, since a part of the first conductive layer of the first OLED substrate is performed as the first electrode plate of the storage capacitor, and another part is performed as the gate electrodes of the first transistor, the gate electrode of the first transistor, the first electrode plate of the storage capacitor and the connection therebetween may be completed in a single step, and there is no need to fabricate a connection structure therebetween after the gate electrode of the first transistor and the first electrode plate of the storage capacitor are formed. The manufacturing process of the first driving circuit unit can be simplified. The first OLED substrate (i.e., the above-mentioned transparent OLED substrate) and the second OLED substrate include: a base substrate; a driving circuit layer formed on the base substrate; and a light emitting functional film layer formed on the driving circuit layer.

The first OLED substrate of the array substrate may be at least partially surrounded by the second OLED substrate.

In one embodiment, the driving circuit layer of the second OLED substrate includes a plurality of second driving circuit units. The number of transistors included in the second driving circuit unit is greater than or equal to the number of transistors included in the first driving circuit unit. Optionally, the first driving circuit unit may be a 2T1C driving circuit (that is, the first driving circuit unit includes two transistors and one storage capacitor), or the first driving circuit unit may be a 3T1C driving circuit (that is, the first driving circuit unit includes three transistors and one storage capacitor). The second driving circuit unit may be, for example, a 7T1C circuit (that is, the second driving circuit unit includes seven transistors and one storage capacitor), a 5T1C circuit (that is, the second driving circuit unit includes five transistors and one storage capacitor), and a 4T1C circuit (that is, the second driving circuit unit includes four transistors and one storage capacitor). With such an arrangement, the structure of the first driving circuit unit is less complex than the structure of the second driving circuit unit, so that the area of the conductive layer of the driving circuit layer of the first OLED substrate is small, thereby improving the light transmittance of the first OLED substrate rate.

Embodiments of the present disclosure further provide a display panel/screen including the array substrate mentioned above and a second encapsulation structure. The second encapsulation structure is disposed on the array substrate, and a light sensing element may be provided beneath the first OLED substrate of the array substrate.

In the display panel/screen according to the embodiments of the present disclosure, since a part of the first conductive layer of the first OLED substrate is performed as the first electrode plate of the storage capacitor, and another part is performed as the gate electrode of the first transistor, the gate electrode of the first transistor, the first electrode plate of the storage capacitor as well as a connection therebetween may be completed in a single step, and there is no need to fabricate a connection structure therebetween after the gate electrode of the first transistor and the first electrode plate of the storage capacitor are formed. In this way, the manufacturing process of the first driving circuit unit can be simplified, thereby simplifying the manufacturing process of the driving circuit layer of the first OLED substrate.

The second encapsulation structure may be a thin-film encapsulation structure, and the thin-film encapsulation structure may include a stack structure in which one or more organic layers and one or more inorganic layers are alternately laminated. Both the organic layers and the inorganic layers are made of transparent material. And the material of the inorganic layers is, for example, $SiO_2$, SiNx, $Al_2O_3$, etc. The material of the organic layers may be, for example, PI, PET, etc. The second encapsulation structure may further be a glass cover or a glass frit encapsulation structure.

Embodiments of the present disclosure further provide a display device, which includes a device body and the display panel/screen mentioned above. The device body includes a component region, and the display panel/screen covers the device body. The component region is located beneath the first OLED substrate, and the component region is provided with a light sensing element that collects light through the first OLED substrate.

The light sensing element may include a camera and/or a light sensor. In the component region, other elements in addition to the light sensing element, such as a gyroscope or an earpiece, may further be provided.

The component region may be a notched region, and the first OLED substrate of the display panel/screen may be arranged corresponding to the notched region, so that the light sensing element can collect external light through the first OLED substrate and perform other operations.

In the above display device, a part of the first conductive layer of the first OLED substrate is performed as the first electrode plate of the storage capacitor, and another part is performed as the gate electrode of the first transistor. The gate electrode of the first transistor, the first electrode plate of the storage capacitor as well as a connection therebetween may be completed through a single step, and there is no need to manufacture a connection structure therebetween after the gate electrode of the first transistor and the first electrode plate of the storage capacitor are formed. A manufacturing process of the first driving circuit unit can be simplified, thereby simplifying the manufacturing process of the driving circuit layer of the first OLED substrate.

The aforementioned electronic device such as a display device may be a digital device such as a mobile phone, a tablet PC, a palmtop computer, an ipad, an ipod, or the like.

In the drawings, the size of layers and regions may be exaggerated for the sake of clear illustration. And it is understood that when an element or layer is referred to as "on" another element or layer, it can be directly on the another element or an intervening layer may exist. In addition, it can be understood that when an element or layer is referred to as "beneath" another element or layer, it can be directly beneath the another element, or more than one intervening layer or element may exist. In addition, it should be further understood that when a layer or element is referred to as "between" two layers or two elements, it can be the only layer between the two layers or two elements, or more than one intermediate layer or element may further exist. Similar reference signs designate similar elements throughout the description.

The invention claimed is:

1. A transparent OLED substrate comprising:
 a base substrate;
 a driving circuit layer, formed on the base substrate; and
 a light emitting functional film layer, formed on the driving circuit layer;
 wherein the driving circuit layer comprises a plurality of first driving circuit units, the plurality of first driving circuit units each comprise a storage capacitor and a first transistor, the storage capacitor comprises a first electrode plate and a second electrode plate, and wherein the driving circuit layer further comprises a first conductive layer, a part of the first conductive layer is performed as the first electrode plate and other part is performed as a gate electrode of the first transistor;

the driving circuit layer further comprises a power supply line, a data line, a scan line, and a plurality of anode layers in one to one correspondence with the plurality of first driving circuit units;

the driving circuit layer further comprises a second conductive layer, a part of the second conductive layer is performed as the second electrode plate of the storage capacitor, and other part is performed as the power supply line;

the first driving circuit units each further comprise a second transistor, a source electrode of the first transistor is electrically connected with the second conductive layer and a drain electrode of the first transistor is electrically connected with a corresponding one of the anode layers, a gate electrode of the second transistor is connected with the scan line, a drain electrode of the second transistor is electrically connected with the first conductive layer, and a source electrode of the second transistor is connected with the data line.

2. The transparent OLED substrate according to claim 1, wherein the first transistor, the second transistor, the storage capacitor, the data line, the scan line, and the anode layers comprise transparent material.

3. The transparent OLED substrate according to claim 2, wherein a light transmittance of the transparent material is greater than or equal to 90%.

4. The transparent OLED substrate according to claim 3, wherein the transparent material is indium tin oxide or indium zinc oxide.

5. The transparent OLED substrate according to claim 1, wherein the driving circuit layer further comprises a power supply line, a data line, a first scan line, a second scan line, a reference potential line and a plurality of anode layers in one to one correspondence with the plurality of first driving circuit units;

the driving circuit layer further comprises a third conductive layer, a part of the third conductive layer is performed as the second electrode plate of the storage capacitor, and other part is performed as a corresponding one of the anode layers;

the first driving circuit units each further comprise a third transistor and a fourth transistor, a source electrode of the third transistor is connected with the data line, a gate electrode of the third transistor is connected with the first scan line and a drain electrode of the third transistor is electrically connected with the first conductive layer, a drain electrode of the first transistor is electrically connected with the power supply line, a source electrode of the first transistor is electrically connected with the third conductive layer, a gate electrode of the fourth transistor is connected with the second scan line, a source electrode of the fourth transistor is connected with the reference potential line and a drain electrode of the fourth transistor is electrically connected with the third conductive layer.

6. The transparent OLED substrate according to claim 5, wherein the first transistor, the third transistor, the fourth transistor, the storage capacitor, the data line, the first scan line, the second scan line, the reference potential line and the anode layers comprise transparent material.

7. The transparent OLED substrate according to claim 6, wherein a light transmittance of the transparent material is greater than or equal to 90%.

8. The transparent OLED substrate according to claim 7, wherein the transparent material is indium tin oxide or indium zinc oxide.

9. A transparent display panel, comprising:

the transparent OLED substrate according to claim 1; and a first encapsulation layer, wherein the first encapsulation layer is provided on a side of the transparent OLED substrate away from the base substrate.

10. An array substrate, comprising:

a first OLED substrate and a second OLED substrate; wherein:

the first OLED substrate comprises the transparent OLED substrate according to claim 1 and the second OLED substrate is a non-transparent OLED substrate;

the first OLED substrate and the second OLED substrate share a base substrate and the light emitting functional film layer of the first OLED substrate and a light emitting functional film layer of the second OLED substrate are formed in a same process, and the first OLED substrate is at least partially surrounded by the second OLED substrate.

11. The array substrate according to claim 10, wherein a driving circuit layer of the second OLED substrate comprises a plurality of second driving circuit units, and a number of transistors in each of the second driving circuit units is larger than or equal to a number of transistors in each of the first driving circuit units.

12. The array substrate according to claim 10, wherein the driving circuit layer further comprises a power supply line, a data line, a scan line, and a plurality of anode layers in one to one correspondence with the plurality of first driving circuit units;

the driving circuit layer further comprises a second conductive layer, a part of the second conductive layer is performed as the second electrode plate of the storage capacitor, and other part is performed as the power supply line;

the first driving circuit units each further comprise a second transistor, a source electrode of the first transistor is electrically connected with the second conductive layer and a drain electrode of the first transistor is electrically connected with a corresponding one of the anode layers, a gate electrode of the second transistor is connected with the scan line, a drain electrode of the second transistor is electrically connected with the first conductive layer and a source electrode of the second transistor is connected with the data line.

13. The array substrate according to claim 12, wherein the first transistor, the second transistor, the storage capacitor, the data line, the scan line, and the anode layers comprise transparent material;

wherein a light transmittance of the transparent material is greater than or equal to 90%.

14. The array substrate according to claim 10, wherein the driving circuit layer further comprises a power supply line, a data line, a first scan line, a second scan line, a reference potential line and a plurality of anode layers in one to one correspondence with the plurality of first driving circuit units;

the driving circuit layer further comprises third conductive layer, a part of the third conductive layer is performed as the second electrode plate of the storage capacitor, and other part is performed as a corresponding one of the anode layers;

the first driving circuit units each further comprise a third transistor and a fourth transistor, a source electrode of the third transistor is connected with the data line, a gate electrode of the third transistor is connected with the first scan line and a drain electrode of the third transistor is electrically connected with the first conductive layer, a drain electrode of the first transistor is electrically connected with the power supply line, a source electrode of the first transistor is electrically connected with the third conductive layer, a gate electrode of the fourth transistor is connected with the second scan line, a source electrode of the fourth transistor is connected with the reference potential line and a drain electrode of the fourth transistor is electrically connected with the third conductive layer.

15. The array substrate according to claim 14, wherein the first transistor, the third transistor, the fourth transistor, the storage capacitor, the data line, the first scan line, the second scan line, the reference potential line and the anode layers comprise transparent material;

wherein a light transmittance of the transparent material is greater than or equal to 90%.

16. A display panel, comprising:

the array substrate according to claim 10; and a second encapsulation structure;

wherein the second encapsulation structure is provided on the array substrate, and one or more light sensing elements are disposed beneath the first OLED substrate of the array substrate.

17. A display device, comprising:

a device body comprising a component region; and the display panel according to claim 16 covering on the device body;

wherein the component region is located beneath the first OLED substrate, and the component region is provided with one or more light sensing elements collecting light through the first OLED substrate.

18. The display device according to claim 17, wherein the one or more light sensing elements comprises a camera and/or a light sensor.

* * * * *